(12) United States Patent
Aromin et al.

(10) Patent No.: US 11,037,700 B2
(45) Date of Patent: Jun. 15, 2021

(54) LCDI POWER CORD SYSTEM AND METHOD

(71) Applicant: Tower Manufacturing Corporation, Providence, RI (US)

(72) Inventors: Victor V Aromin, West Warwick, RI (US); Louis Jay Shatkin, Warwick, RI (US)

(73) Assignee: Tower Manufacturing Corporation, Providence, RI (US)

( * ) Notice: Subject to any disclaimer, the term of this patent is extended or adjusted under 35 U.S.C. 154(b) by 0 days.

(21) Appl. No.: 17/139,197

(22) Filed: Dec. 31, 2020

(65) Prior Publication Data

US 2021/0125746 A1 Apr. 29, 2021

Related U.S. Application Data

(63) Continuation-in-part of application No. 16/935,895, filed on Jul. 22, 2020.

(60) Provisional application No. 63/013,742, filed on Apr. 22, 2020, provisional application No. 62/880,970, filed on Jul. 31, 2019, provisional application No. 62/876,960, filed on Jul. 22, 2019.

(51) Int. Cl.
| | |
|---|---|
| *H02H 3/00* | (2006.01) |
| *H01B 9/02* | (2006.01) |
| *H01B 13/22* | (2006.01) |
| *G01R 31/52* | (2020.01) |
| *G01R 31/12* | (2020.01) |

(52) U.S. Cl.
CPC ............ *H01B 9/029* (2013.01); *H01B 9/021* (2013.01); *H01B 13/22* (2013.01); *G01R 31/12* (2013.01); *G01R 31/52* (2020.01)

(58) Field of Classification Search
None
See application file for complete search history.

(56) References Cited

U.S. PATENT DOCUMENTS

| | | | |
|---|---|---|---|
| 4,903,161 A * | 2/1990 | Huber | H02H 3/04 361/103 |
| 4,918,977 A | 4/1990 | Takahaski et al. | |
| 5,465,013 A * | 11/1995 | Bassen | H01R 13/648 219/528 |
| 5,517,165 A | 5/1996 | Cook | |
| 5,642,248 A * | 6/1997 | Campolo | H01R 13/7135 361/115 |
| 6,144,209 A | 12/2000 | Raymond et al. | |
| 6,218,647 B1 | 4/2001 | Jones | |
| 7,307,211 B1 | 12/2007 | Caccia | |
| 7,358,443 B2 * | 4/2008 | Shatkin | H01B 9/021 174/102 R |
| 7,492,558 B2 | 2/2009 | Germain et al. | |
| 8,384,502 B2 | 2/2013 | Gao | |
| 8,587,914 B2 | 11/2013 | Kamor et al. | |
| 8,659,857 B2 | 2/2014 | Gandolfi | |
| 8,760,824 B2 | 6/2014 | Armstrong | |
| 9,312,680 B2 | 4/2016 | Li et al. | |

(Continued)

*Primary Examiner* — Stephen W Jackson

(57) ABSTRACT

A system and method for an LCDI power cord and associated circuits is provided. The system and method include energizing shielded neutral wires and shielded line wires and monitoring the energized shields for surges, e.g., arcing, detected by a Leakage Current Detection Circuit (LCDC) and/or voltage drops, e.g., shield breaks, detected by a Shield Integrity Circuit (SIC).

25 Claims, 19 Drawing Sheets

(56) References Cited

U.S. PATENT DOCUMENTS

| | | |
|---|---|---|
| 9,450,395 B2 | 9/2016 | Aromin et al. |
| 9,478,382 B1 | 10/2016 | Aromin |
| 9,608,433 B2 | 3/2017 | Simonin |
| 9,966,165 B2 | 5/2018 | Gross et al. |
| 10,001,526 B2 | 6/2018 | Salas |
| 10,020,649 B2 | 7/2018 | Du |
| 2005/0243485 A1 | 11/2005 | Gershen et al. |
| 2011/0209894 A1 | 9/2011 | Williams et al. |
| 2018/0017611 A1 | 1/2018 | Radun et al. |
| 2018/0337530 A1 | 11/2018 | Gariboldi et al. |

* cited by examiner

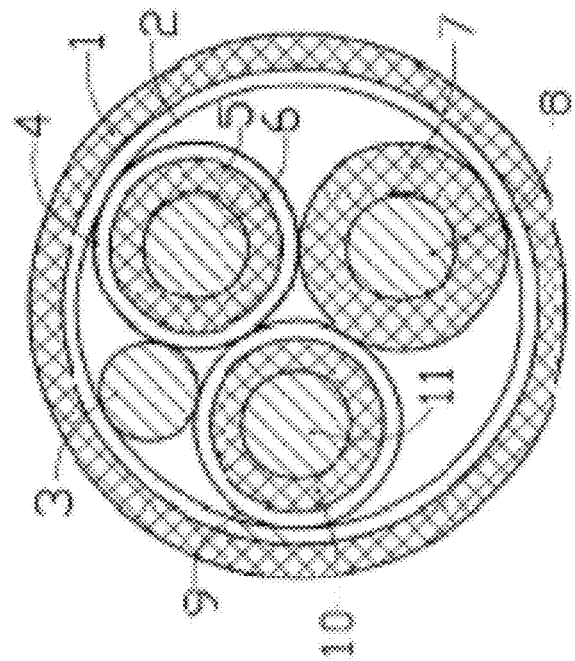
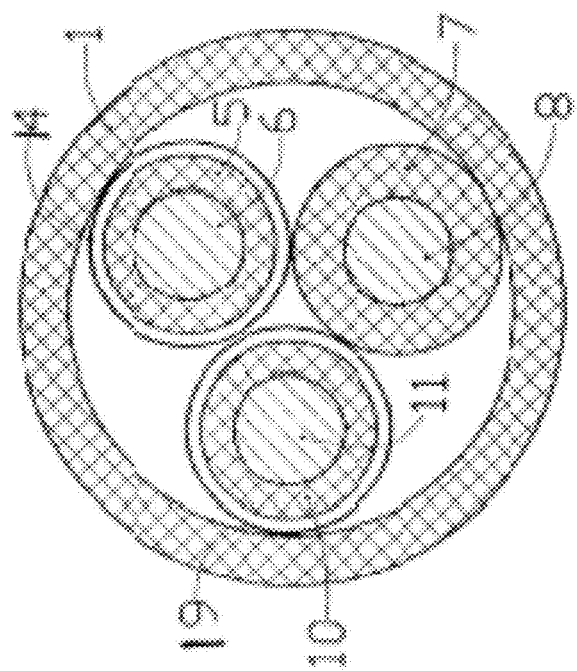

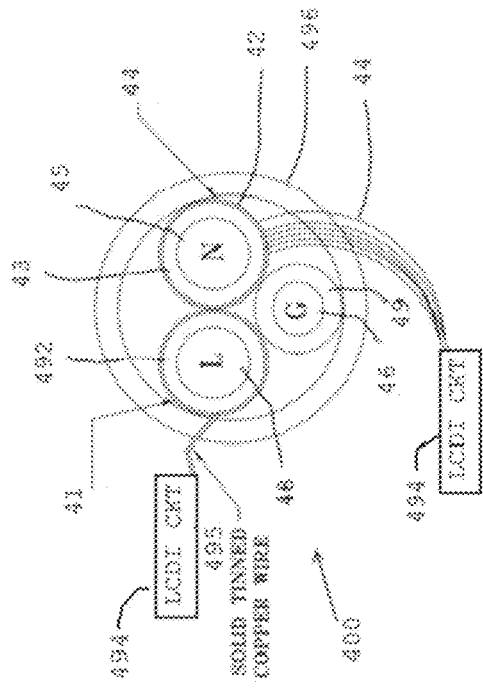
FIG. 3A
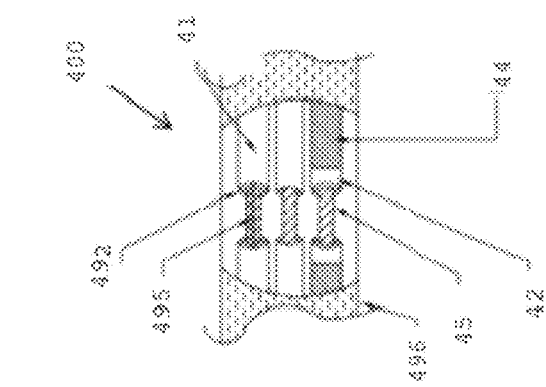
FIG. 3
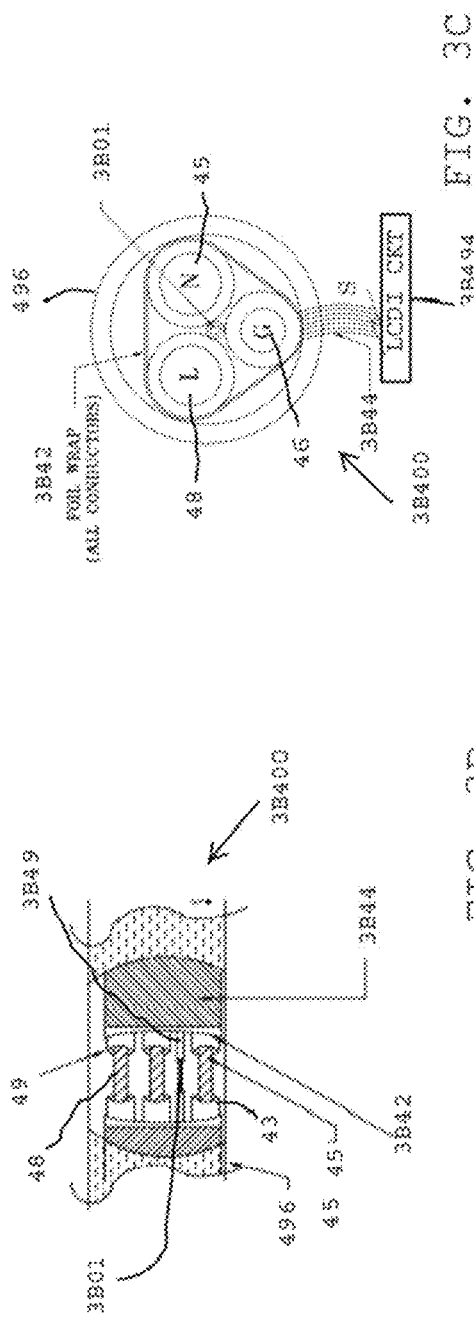
FIG. 3C
FIG. 3B

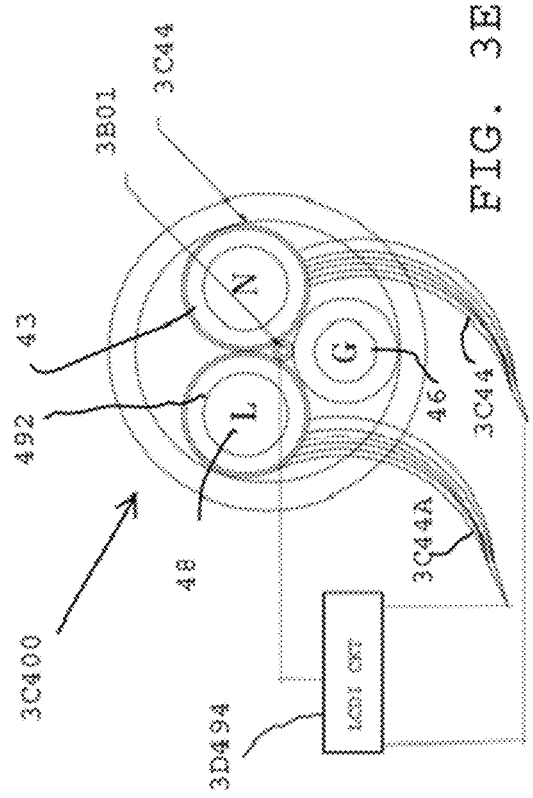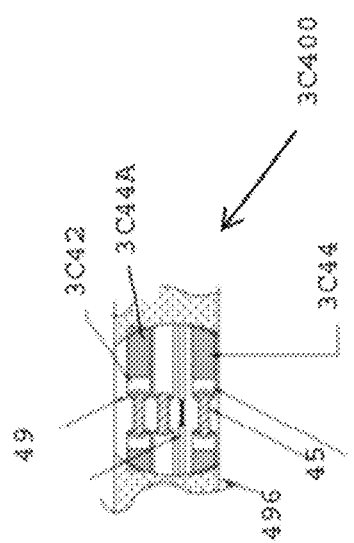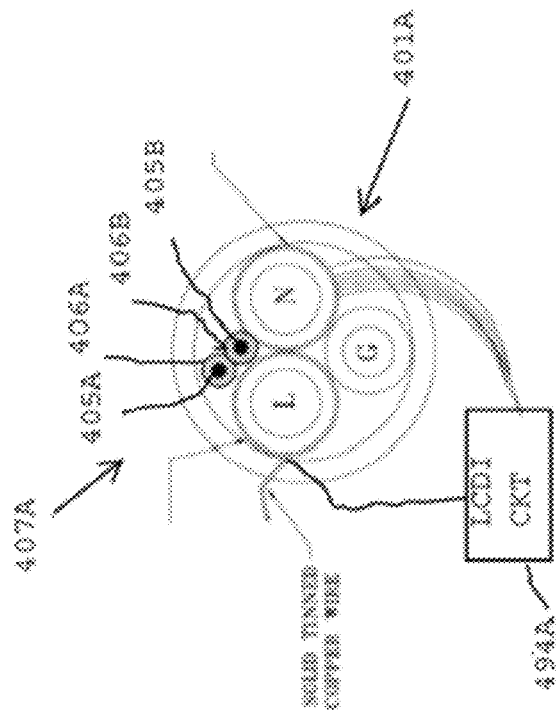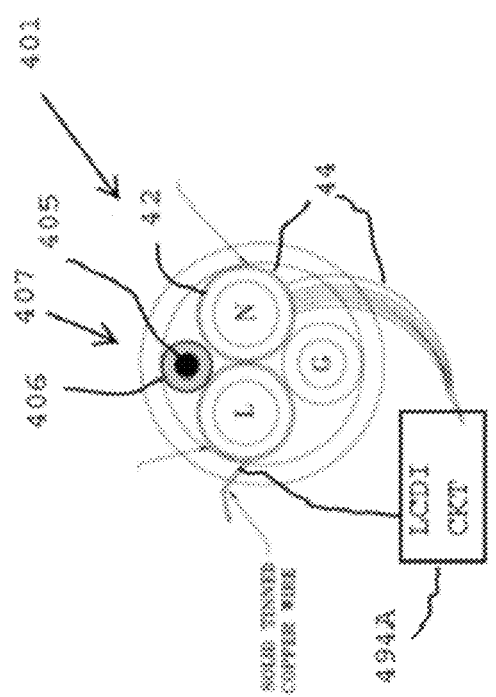
FIG. 3E
FIG. 3D
FIG. 4A
FIG. 4

LCDI POWER CORD SYSTEM AND METHOD

CROSS-REFERENCE TO RELATED APPLICATIONS

The present continuation-in-part application is related to, claims the earliest available effective tiling date(s) from (e.g., claims earliest available priority dates for other than provisional patent applications; claims benefits under 35 USC§ 119(e) for provisional patent applications), and incorporates by reference in its entirety all subject matter of the following listed application(s) (the "Related Applications") to the extent such subject matter is not inconsistent herewith; the present application also claims the earliest available effective filing date(s) from, and also incorporates by reference in its entirety all subject matter of any and all parent, grandparent, great-grandparent, etc. applications of the Related Application(s) to the extent such subject matter is not inconsistent herewith:

U.S. provisional patent application 63/013,742, entitled "LCDI Shield Continuity Monitoring Circuits", naming Victor V. Aromin as first inventor, filed 22 Apr. 2020. And U.S. patent application Ser. No. 16/935,895 which claims priority from U.S. provisional patent application 62/876,960, entitled "Power Cord", naming Victor V. Aromin as first inventor, filed 22 Jul. 2019; and U.S. provisional patent application 62/880,970, entitled "Power Cord", naming Victor V. Aromin as first inventor, filed 31 Jul. 2019.

BACKGROUND

1. Field of Use

This invention relates to a power cord. In particular, it relates to a power cord for an appliance that has a built-in leakage current detection and interruption (LCDI) conductor for detecting a leakage current in the power cord.

2. Description of Prior Art (Background)

With the wide use of household electrical appliances, such as air conditioners, washing machines, refrigerators, etc, more attention is being paid to the safety of using such appliances. An appliance typically has a power cord of one meter or longer. As shown in FIG. 1, such a power cord is made of three copper wires 11, 6 and 8 for carrying power, three insulating layers (made of rubber or plastic) 10, 5, and 7 surrounding the respective copper wires, two metal sheaths 19 and 14 (made of thin copper wires woven together) surrounding two insulating layer, respectively, and an outer insulating layer 1 (made of rubber or plastic) enclosing the wires.

Such a power cord may age due to long-term use, or become damaged when the appliance is moved, which may cause a leakage between the phase line and the neutral or ground lines in the cord. Such leakage current may cause sparks, which may cause fire and property damages. To quickly and accurately detect leakage current in the power cord, an additional conductor is provided and electrically connected to the metal sheath 19, 14. Leakage current can be detected by detecting a voltage on the metal sheath. The metal sheaths are conventionally made by weaving thin copper wires. The cost of the power cord has increased due to the increase cost of the copper material.

Another prior art solution is shown in FIG. 2. A power cord includes three copper wires 11, 6 and 8 for carrying power and a leakage current detection conductor 3 for detecting a leakage current in the power cord. As before the three copper wires 11, 6 and 8 are surrounded by three insulating layers (made of rubber or plastic) 10, 5, and 7, respectively. Two insulating layers 10, 5 are surrounded by metal conductive layers 9, 4, respectively. The leakage current detection conductor 3 is provided adjacent the two metal conductive layers 9, 4 and is in contact with both of them. A metal sheath 2 encloses the three wires with their respective insulating layers and metal conductive layers as well as the leakage current detection conductor 3. An outer insulating layer 1 (made of rubber or plastic) is provided outside of the metal sheath 2.

The metal conductive layers 9, 4 may be made of a thin copper foil, tin foil, aluminum foil, or conductive rubber. The leakage current detection conductor 3 may be formed of one or more copper wires or aluminum wires. When leakage current is present between copper wires 11 and 6, 11 and 8, or 6 and 8, the leakage current detection conductor 3 can detect the leakage current via the metal conductive layers 9 or 4. As shown in FIG. 2, this prior art solution requires another conductive sheath 2 surrounding all the cables and the detection conductor 3.

BRIEF SUMMARY

Accordingly, the present invention provides a power cord useful for appliances such as air conditioners, washing machines, refrigerators, etc. which has a built-in leakage current detection conductor for detecting a leakage current in the power cord.

In accordance with one embodiment of the present invention an alternating current (AC) power cord is provided. The AC power cord includes a neutral wire assembly, having an insulated conductive neutral wire and a conductive neutral wire shield surrounding the insulated neutral wire insulator. The conductive neutral wire shield includes a conductive side and a non-conductive side and is wrapped around the insulated neutral wire with the conductive side facing outwards. The AC power cord includes a conductive flexible media wrapped around the conductive side of the neutral wire shield. The AC power cord also includes a line wire, assembly, wherein the line wire assembly includes a conductive shield having a conductive side and a non-conductive side and is wrapped around the insulated line wire with the conductive side facing inwards. The conductive neutral wire shield and the conductive line wire shield are connected in series at one end of the AC power cord.

The invention is also directed towards an alternating current (AC) power cord having an insulated neutral wire, an insulated line wire, an insulated return wire, and a ground wire. Also included is a conductive shield surrounding the insulated neutral wire, the insulated line wire, the insulated return wire, and the ground wire. The conductive shield includes an outwardly facing conductive side and an inwardly facing non-conductive side. A conductive flexible media surrounds the conductive side of the conductive shield. The conductive flexible media and the return wire are connected in series at one end of the power cord.

In accordance with another embodiment of the present invention an AC power cord is presented. The AC power cord includes an insulted neutral wire surrounded by a conductive neutral wire shield having a conductive side and a non-conductive side. The conductive side of the neutral wire shield faces outwards. Surrounding the neutral wire shield is a conductive flexible media. The AC power cord also includes an insulted line wire surrounded by a conductive line wire shield having a conductive side and a non-conductive side. The conductive side of the line wire shield faces outwards. Surrounding the line wire shield is a second conductive flexible media. The conductive line wire shield and the conductive neutral wire shield are connected in series at one end of the AC power cord.

In Accordance with another embodiment of the present invention Leakage Current Detection Interrupter (LCDI) circuit for interrupting AC power from an AC source is provided. The LCDI circuit is electrically connectable to an insulated neutral wire surrounded by a neutral wire shield (NWS) and an insulated line wire surrounded by a line wire shield (LWS). The LCDI circuit also includes a power supply circuit for supplying a rectified waveform and a floating load connected to the power supply circuit. The floating load connected to the power supply circuit includes a leakage current detection circuit (LCDC) for detecting leakage current from the insulated neutral wire or the insulated line wire and a shield integrity circuit (SIC) for monitoring the NWS and LWS integrity.

The invention is also directed towards a method for constructing a power cord and circuit for detecting and interrupting line voltage between an alternating current (AC) line end and a load end of the power cord upon detection of a power cord fault. The method includes providing an insulated conductive neutral wire between the load end and AC line end of the power cord and wrapping the insulated conductive neutral wire with a neutral wire shield having a conductive side of the neutral wire shield facing out. The method includes wrapping a conductive flexible media around the conductive side of the neutral wire shield. The method further includes providing and line wire shield having a conductive side and a non-conductive side an insulated conductive line wire and wrapping the line wire shield around a tinned wire and an insulated line wire with the conducting side facing in and in electrical contact with the tinned wire. The method includes connecting the tinned wire to the conductive flexible media in series at the load end of the power cord. The method further includes interrupting line voltage if current between the insulated line or insulated neutral wire and any one of the shields is detected; and/or includes interrupting line voltage if shield integrity is compromised or otherwise broken, such as, for example, a break in a shield or corrosion. The method also includes providing a rectifying power supply circuit for energizing the neutral wire shield with a voltage.

In accordance with another embodiment of the present invention a method for interrupting AC line voltage between an alternating current (AC) line end and a load end of a shielded power cord upon detection of a power cord fault is provided. The method includes providing a leakage current detection circuit (LCDC) for detecting AC leakage current from the power cord and interrupting line voltage between the AC line end and the load end of the shielded power cord if leakage current is detected. The method includes connecting the LCDC and SIC to the shielded power cord and providing a power supply circuit (PSC) for energizing the LCDC, SIC, and the shielded power cord with a voltage. Providing the LCDC further includes providing a bi-stable latching device having an on/off state and a charge holding device connected to a controlling port of the bi-stable latching device; such as, for example, a transistor base or an SCR gate port. The method includes, during normal operation, charging the charge holding device to a charge less than the trigger charge needed to trigger the bi-stable latching device to its on-state, but of sufficient charge to minimize the time needed to trigger the device if a fault is detected and to minimize damaging inrush current. The method further includes providing a shield integrity circuit (SIC) for monitoring shielded power cord integrity and interrupting line voltage between the AC line end and the load end of the shielded power cord if shield integrity is compromised.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1 is a cross-sectional view showing the structure of a conventional power cord;

FIG. 2 is a cross-sectional view showing the structure of another conventional power cord with a leakage current detection conductor;

FIG. 3 is a cut away side view showing the structure of a power cord with leakage current detection conductors according to an alternate embodiment of the present invention;

FIG. 3A is a cross-sectional view showing the structure the power cord shown in FIG. 3;

FIG. 3B is a cut away side view showing the structure of a power cord with leakage current detection conductors according to an alternate embodiment of the present invention;

FIG. 3C is a cross-sectional view showing the structure the power cord shown in FIG. 3B;

FIG. 3D is a cut away side view showing the structure of a power cord with leakage current detection conductors according to an alternate embodiment of the present invention;

FIG. 3E is a cross-sectional view showing the structure the power cord shown in FIG. 3D;

FIG. 4 is a cut away side view showing the structure of a power cord with leakage current detection conductors and an immersion detection cable according to an embodiment of the present invention;

FIG. 4A is a cut away side view showing the structure of a power cord with leakage current detection conductors and a twisted pair immersion detection cable according to an embodiment of the present invention;

DETAILED DESCRIPTION

Figure 5:
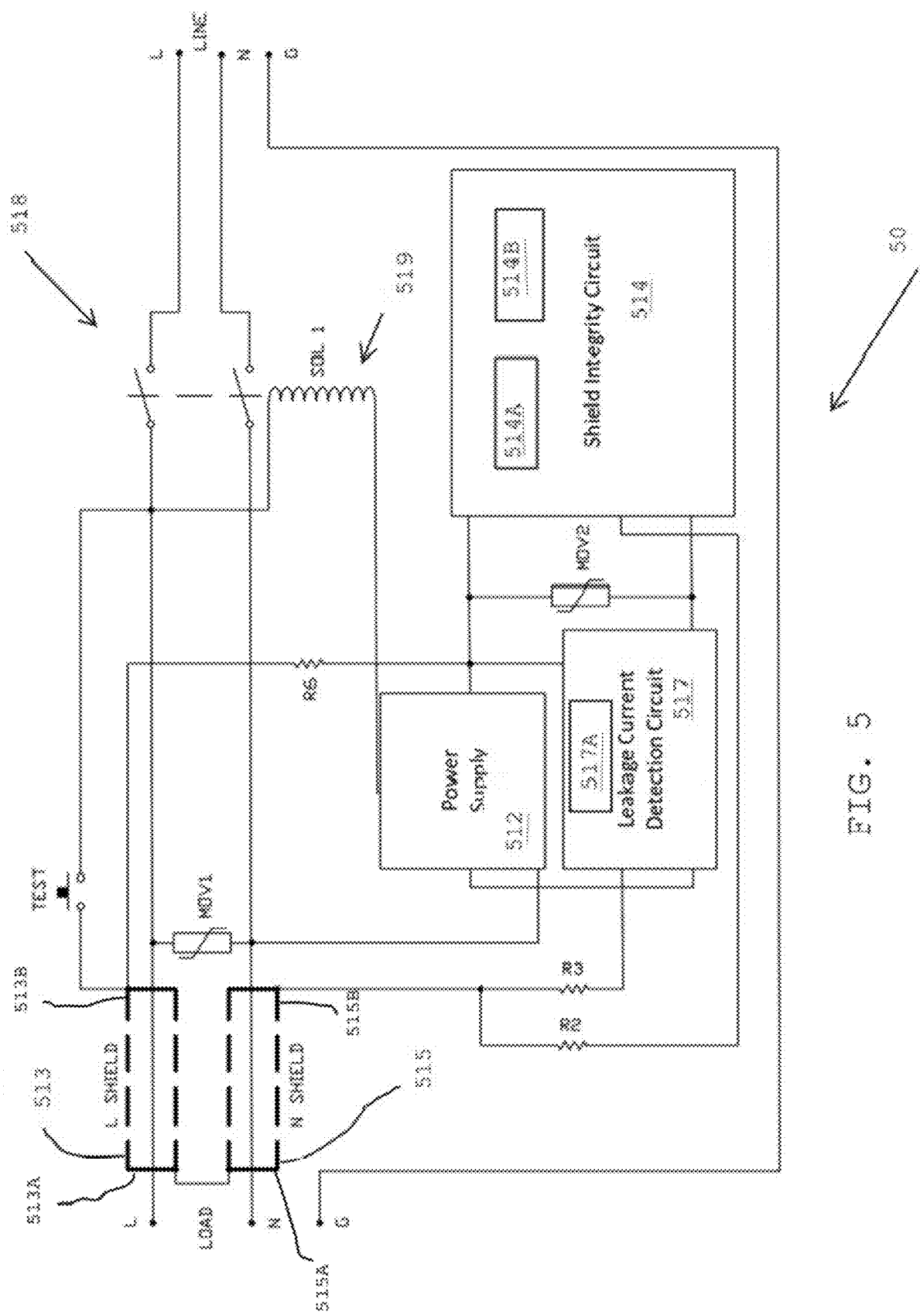
FIG. 5 is a circuit block diagram of a LCDI circuit connectable to the power cords shown in FIG. 1, FIG. 2, FIG. 3, FIG. 3A-E.

The following brief definition of terms shall apply throughout the application:

The term "comprising" means including but not limited to, and should be interpreted in the manner it is typically used in the patent context;

The phrases "in one embodiment," "according to one embodiment," and the like generally mean that the particular feature, structure, or characteristic following the phrase may be included in at least one embodiment of the present invention, and may be included in more than one embodiment of the present invention (importantly, such phrases do not necessarily refer to the same embodiment);

If the specification describes something as "exemplary" or an "example," it should be understood that refers to a non-exclusive example; and If the specification states a component or feature "may," "can," "could," "should," "preferably," "possibly," "typically," "optionally," "for example," or "might" (or other such language) be included or have a characteristic, that particular component or feature is not required to be included or to have the characteristic.

Referring now to FIG. 3 and FIG. 3A of the drawings, there is shown a cut away side view showing the structure of a power cord 400 with leakage current detection conductors according to an alternate embodiment of the present invention. In this embodiment the power cord 400 includes a neutral wire or cable 45, a line wire or cable 48, and a ground wire 46. Each of the wire or cables is surrounded by an insulator layer 43, 49, and 492. In addition, the insulating layers 492 and 43 of the line wire 48 and the neutral wire 45, respectively, are each surrounded by a shield; a conductive medium, 41 and 42, respectively. It is appreciated that the conductive medium 41, 42 has a conductive side and a non-conductive or less conductive side. The conductive medium 41, 42 may be an aluminum foil shielding comprising a thin layer of aluminum and mylar composite tape. The conductive side of conductive medium 41 is facing inwards and the less, or non-conductive side of the conductive medium is facing inwards. The conductive side of conductive medium 42 is facing outwards.

Still referring to FIG. 3 and FIG. 3A power cord 400 also includes a solid tin copper wire 495 disposed between conductive medium 41 and insulator 492. The conductive side of conductive medium 42 is surrounded by a conductive flexible media 44. The conductive flexible media 44 may be any suitable conductive flexible media woven to cover 30% of the surface area of the conductive side of conductive medium 42 per unit length. At least one end of the conductive flexible media 44 may be connected to an LCDI circuit 494. In addition, at least one end of the wire 495 may also be connected to the LCDI circuit 494. The conductive flexible media may be any suitable conductive material such as, for example: conductive coatings, tapes, ribbons, a braided copper flexible media, or a conductive flexible media woven from conductive material such as, but not limited to, high-performance carbon fiber/gold/copper composite wire, conductive graphene wire, or conductive graphene yarn.

It is understood that any if insulators 492 or 43 become defective and current leaks to the conductive side of conductive medium 41 or 42 the current flows through conductive flexible media 44 or wire 495 where it is detected by LCDI circuit 494 and interrupt power between a line source and load.

Referring also to FIG. 3B and FIG. 3C of the drawings, there is shown a cut away side view showing the structure of a power cord 3B400 with leakage current detection conductors according to an alternate embodiment of the present invention. In this embodiment the power cord 3B400 includes a neutral wire or cable 45, a line wire or cable 48, ground wire 46 and a return wire 3B01. Each of the wire or cables is surrounded by an insulator layer 43, 49, 492 (as shown in FIG. 3A) and 3B49. The insulated wires 45, 46, 48 and 3B01 are surrounded wrapped by a shield; i.e., a conductive medium, 3B42. It is appreciated that the conductive medium 3B42 has a conductive side and a non-conductive or less conductive side. The conductive medium 3B42 may be an aluminum foil shielding comprising a thin layer of aluminum and mylar composite tape. The conductive side of conductive medium 3B42 is facing outwards and the less, or non-conductive side of the conductive medium is facing inwards towards the center of power cord 3B400.

Still referring to FIG. 3B and FIG. 3C, the conductive side of the conductive medium 3142 is surrounded by a conductive flexible media 3B44. The conductive flexible media 3B44 may be any suitable conductive flexible media woven to cover 30% of the surface area of the conductive side of the conductive medium 3B42 per unit length. At least one end of the conductive flexible media 44 may be connected to an LCDI circuit 3B494. In addition, at least one end of the return wire 3B01 may also be connected to the LCDI circuit 3B494. The conductive flexible media may be any suitable conductive material such as a copper flexible media, or a conductive flexible media woven from conductive material such as, but not limited to, high-performance carbon fiber/gold/copper composite wire, conductive graphene wire, or conductive graphene yarn.

Referring also to FIG. 3D and FIG. 3E of the drawings, there is shown a cut away side view showing the structure of a power cord 3C400 with leakage current detection conductors according to an alternate embodiment of the present invention. In this embodiment the power cord 3C400 includes a neutral wire or cable 45, a line wire or cable 48, ground wire 46 and a return wire 3B01. Each of the wire or cables is surrounded by an insulator layer 43, 49, and 492.

In addition, the insulating layers 492 and 43 of the line wire 48 and the neutral wire 45, respectively, are each surrounded by a shield, a conductive medium, 3C42 and 3C42A, respectively. It is appreciated that each of the conductive mediums 3C42 and 3C42A has a conductive side and a non-conductive or less conductive side. The conductive medium 3C42 and 3C42A may be an aluminum foil shielding comprising a thin layer of aluminum and mylar composite tape. The conductive side of each of the conductive mediums 3C42 and 3C42A is facing outwards.

Still referring to FIG. 3D and FIG. 3E the conductive side of the conductive mediums 3C42 and 3C42A is surrounded or wrapped by conductive flexible medias 3C44 and 3C44A. The conductive flexible medias 3C44 and 3C44A may be any suitable conductive flexible media woven to cover 30% of the surface area of the conductive side of the conductive mediums 3C42 and 3C42A 2 per unit length. At least one end of the conductive flexible medias 3C44 and 3C44A may be connected to an LCDI circuit 3D494. In addition, at least one end of the return wire 3B01 may also be connected to the LCDI circuit 3D494. The conductive flexible medias 3C44 and 3C44A may be any suitable conductive material such as a copper flexible media, or a conductive flexible media woven from conductive material such as, but not limited to, high-performance carbon fiber/gold/copper composite wire, conductive graphene wire, or conductive graphene yarn.

Referring also to FIG. 4 there is shown a cut away side view showing the structure of a power cord 401 with leakage current detection conductors as described earlier and an immersion detection cable 407 comprising a conducting wire 405 surrounded by an absorbent covering 406. The immersion detection cable 407 is arranged within the power cord 401 to be in close contact with conductive flexible media 44 and/or conductive medium 42. In this embodiment, moisture absorbed by the absorbent covering 406 completes an electrical connection between conducting wire 405 and conductive flexible media 44 and/or conductive medium 42. As is described in more detail herein, the LCDI circuit 494A detects the electrical connection between conducting wire 405 and conductive flexible media 44 and/or conductive medium 42 and interrupt power between a line source and load.

Referring also to FIG. 4A there is shown a cut away side view showing the structure of a power cord 401A with leakage current detection conductors as described earlier and a twisted pair immersion detection cable 407A according to an embodiment of the present invention. The twisted pair immersion detection cable 407A includes conducting wires 405A and 405B, each surrounded by an absorbent covering 406A and 406B, respectively. In this embodiment, moisture absorbed by the absorbent covering 406A and 406B completes an electrical connection between conducting wires 405A and 405B and/or between conducting wires 405A or 405B and conductive flexible media 44 and/or conductive medium 42 and interrupt power between a line source and load. As is described in more detail herein, the LCDI circuit 494 detects the electrical connection and interrupt power between line source and load.

Referring also to FIG. 5 there is shown a circuit block diagram of a LCDI circuit 50 connectable to the power cords shown in FIG. 1, FIG. 2, FIG. 3, or FIG. 3A. LCD circuit 50 includes line shield 513, neutral shield 515, switch 518, power supply circuit 512, leakage current detection circuit (LCDC) 516, solenoid 519, and shield integrity circuit (SIC) 514. As shown herein the LCDE 516 and the SIC 514 comprise a floating load with respect to the power supply 512. SIC 514 includes SIC controller 514A and SIC switch 514B. LCDC 516 includes LCDC switch 517A. Shield 515 is constructed and provided in accordance with any of the shields described earlier. As is described in more detail herein, when manual reset switch 518 is set line voltage is connected to LOAD and to power supply circuit 512 via solenoid 519. Power supply circuit 512 supplies bias voltages to LCDC 517, SIC 514, and shields 513 and 515. Shields 513 and 515, having load ends, 513A and 515A, respectively, are connected in series at their load ends. Power supply 512 is connected to shield 513 at its source end 513B; and, LCDC 517 and SIC 514 are connected to shield 515 at its source or line end 515B. As is discussed and shown in more detail herein, the SC 514 allows a small amount of solenoid current to flow through solenoid 519 but less than the energizing current needed to energize solenoid 519 to disengage manual reset switch 518. It is appreciated that not starting from zero energizing current allows solenoid 519 to energize faster when a fault is detected.

Figure 6:
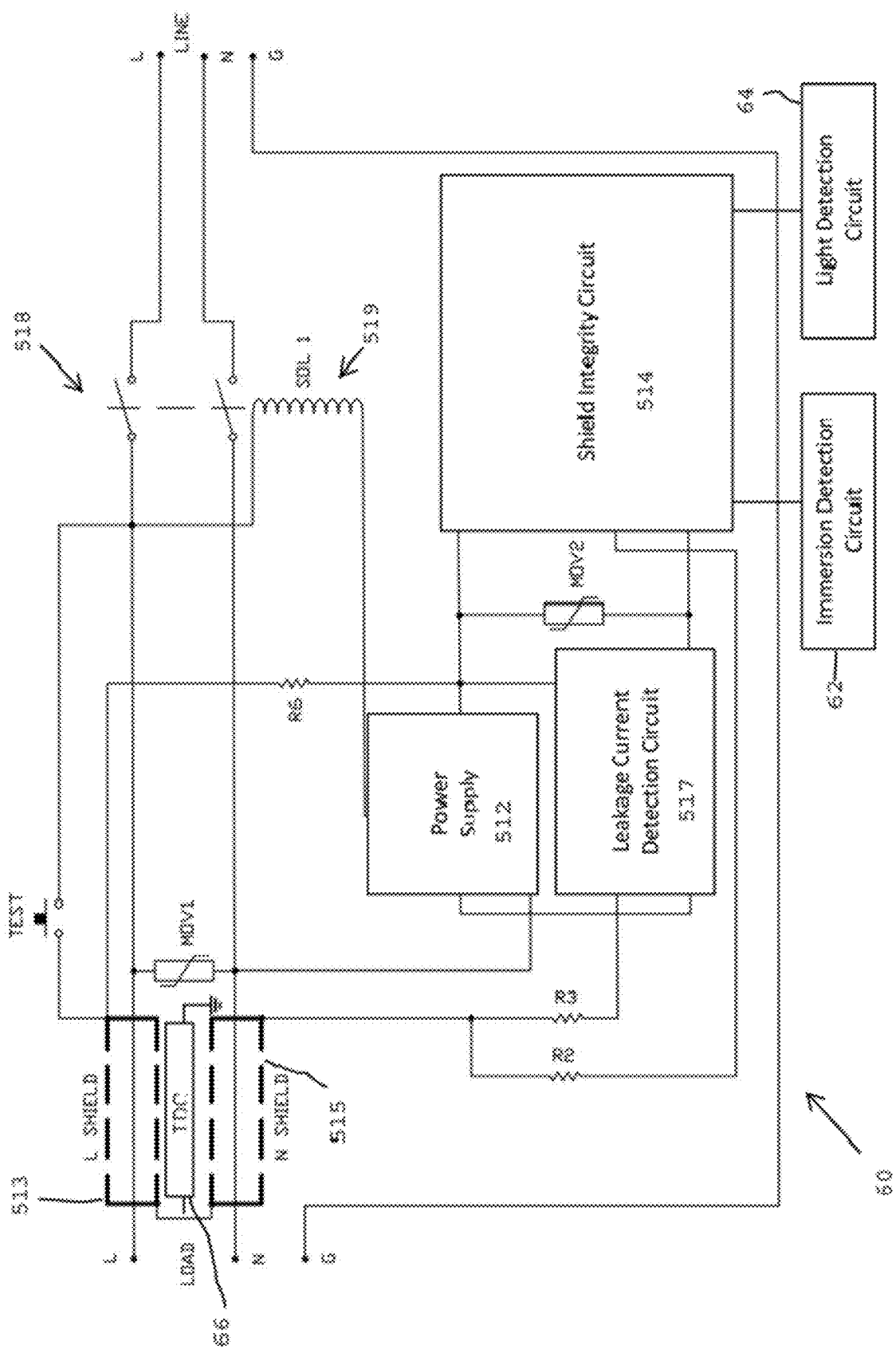
FIG. 6 is a block diagram of a LCDI circuit connectable to the power cords shown in FIG. 4 or FIG. 4A.

Referring also to FIG. 6 there is shown a block diagram of a LCDI circuit 60 connectable to the power cords shown in FIG. 4 or FIG. 4A. It is well known that two dissimilar metals in electrical contact, such as conductive flexible media 44 and conductive layer 42, in the presence of an electrolyte, such as water, begins to galvanically corrode. Thus, IDC 66, connected to SIC 514 causes AC line power to be disconnected from the load if moisture is detected by IDC 66. Immersion detection cable (IDC) 66 can be either the immersion detection cable 407 or the twisted pair immersion detection cable 407A described earlier.

Still referring to FIG. 6, LCDI circuit 60 also includes light detection circuit (LDC) 64 connected to SIC 514. In the presence of light impinging on circuit 60, implying that circuit 60 is exposed to the elements, SIC 514 causes AC line power to be disconnected from the load if light is detected by LCD 64.

Figure 7:
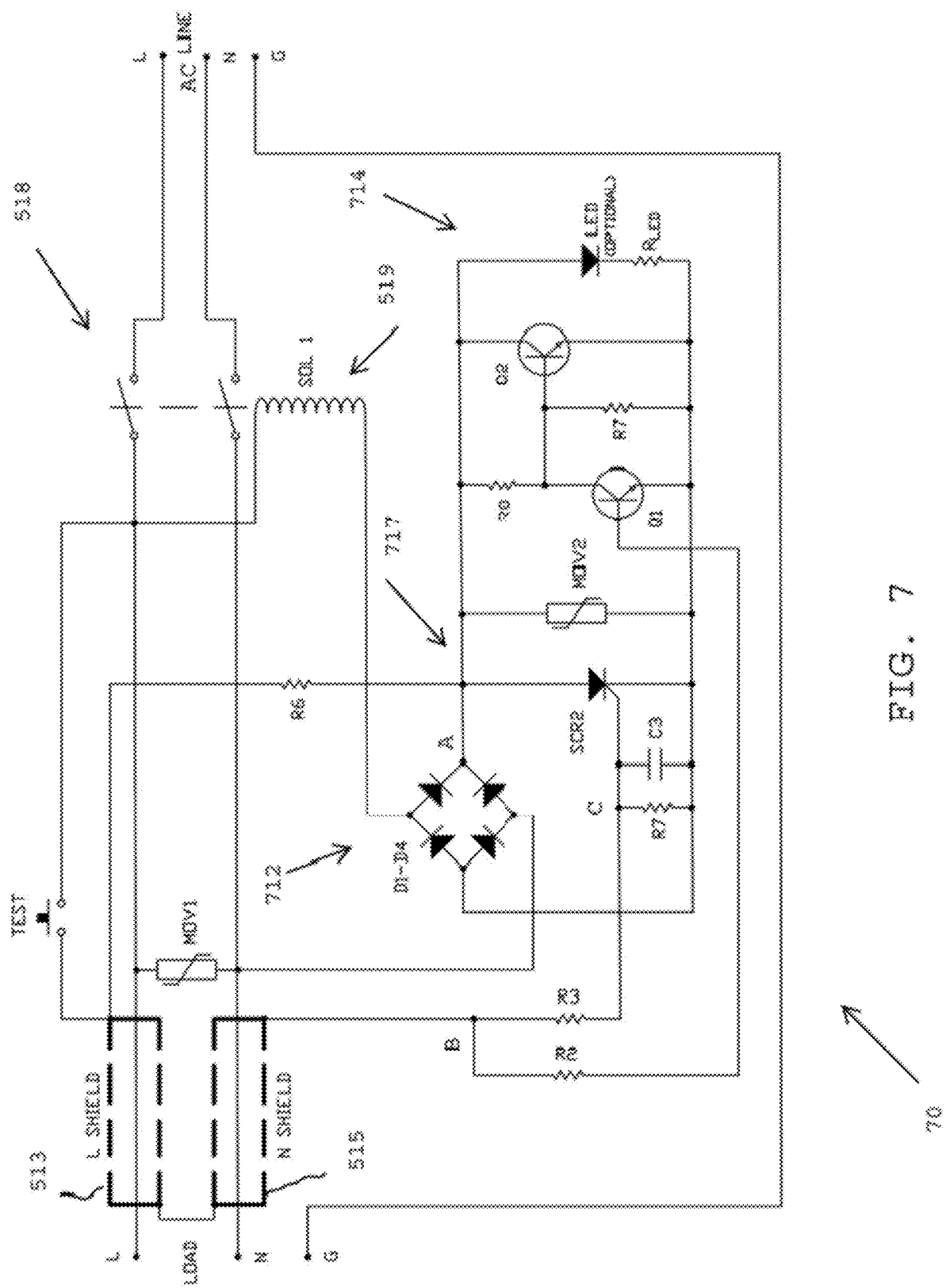
FIG. 7 is a detailed schematic diagram of the block diagram shown in FIG. 5.

Referring also to FIG. 7 there is shown a detailed circuit 70 of the block diagram 50 shown in FIG. 5. LCDI circuit 70 includes line shield 513, neutral shield 515, switch 518, power supply circuit 712, leakage current detection circuit (LCDC) 716, solenoid 519, and shield integrity circuit (SIC) 714. Shield 515 includes conductive layer 42 surrounded by conductive flexible media 44 described earlier. As is described in more detail herein, when manual reset switch 518 is set line voltage is connected to LOAD and to power supply circuit 712 via solenoid 519. Power supply circuit 712 supplies bias voltages to LCDC 717, SIC 714, and shields 513 and 515. As is discussed and shown in more detail herein, the SIC 714 allows a small amount of solenoid current to flow through solenoid 519 but less than the energizing current needed to energize solenoid 519 to disengage manual reset switch 518. It is appreciated that not starting from zero energizing current allows solenoid 519 to energize faster when a fault is detected.

Figure 11A:
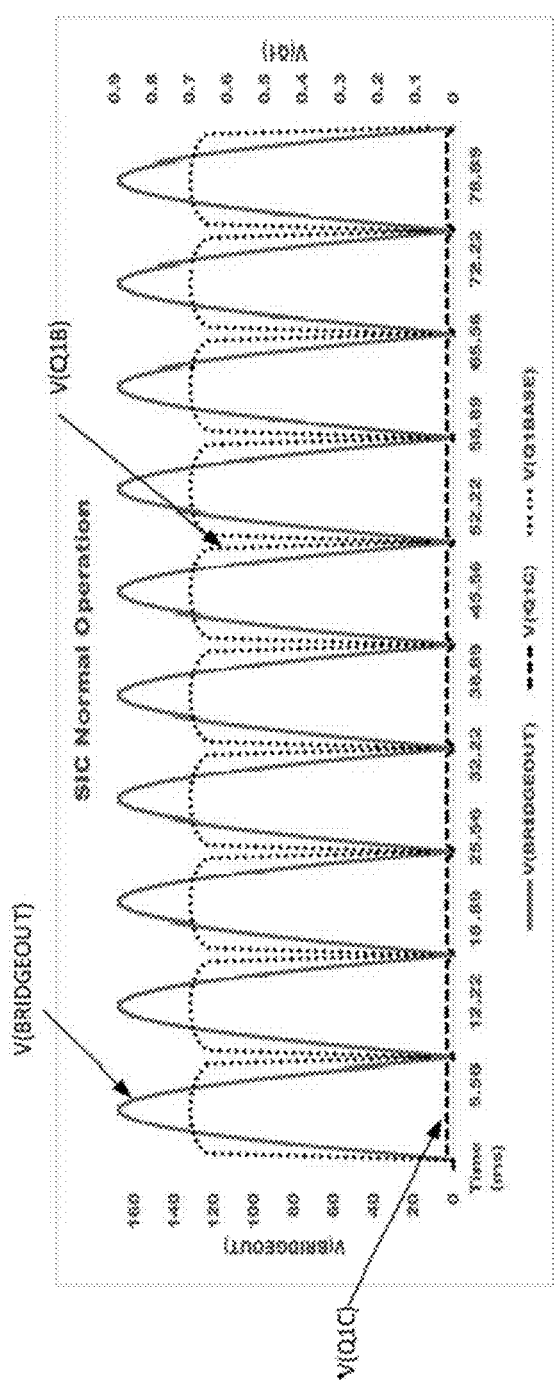
FIG. 11A is a waveform diagram for the normal condition of the Shield Integrity Circuit (SIC) shown in FIG. 7 or FIG. 8.
Figure 11B:
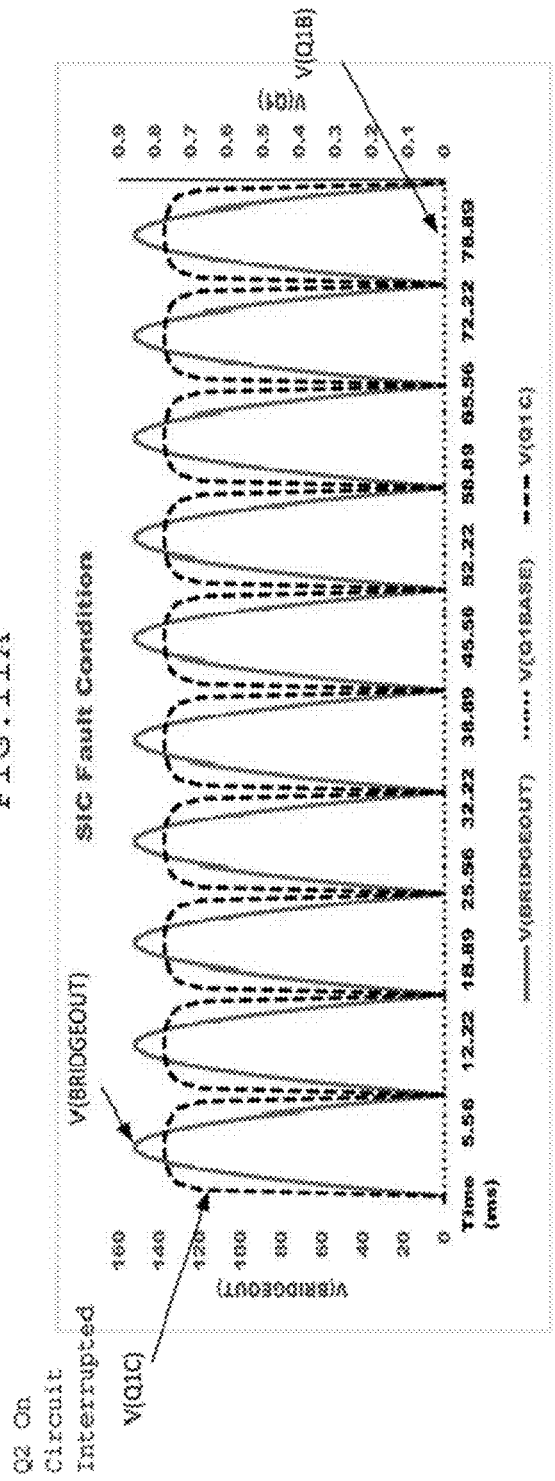
FIG. 11B is a waveform diagram for the fault condition of the SIC shown in FIG. 7.

Still referring to FIG. 7 and FIGS. 11A-11B. When switch 518 is mechanically (manually) engaged AC line voltage is connect to LOAD. 60 Hz AC line voltage is also connected to power supply circuit 712 via solenoid 519. Power supply circuit 712, comprising bridge rectifier (diodes D1-D4) outputs a rectified unsmoothed DC signal at A. The rectified unsmoothed DC signal at A is routed through R6 to LCDC 717 and SIC 714, via shields 513 and 515 connected in series.

Figure 14A:
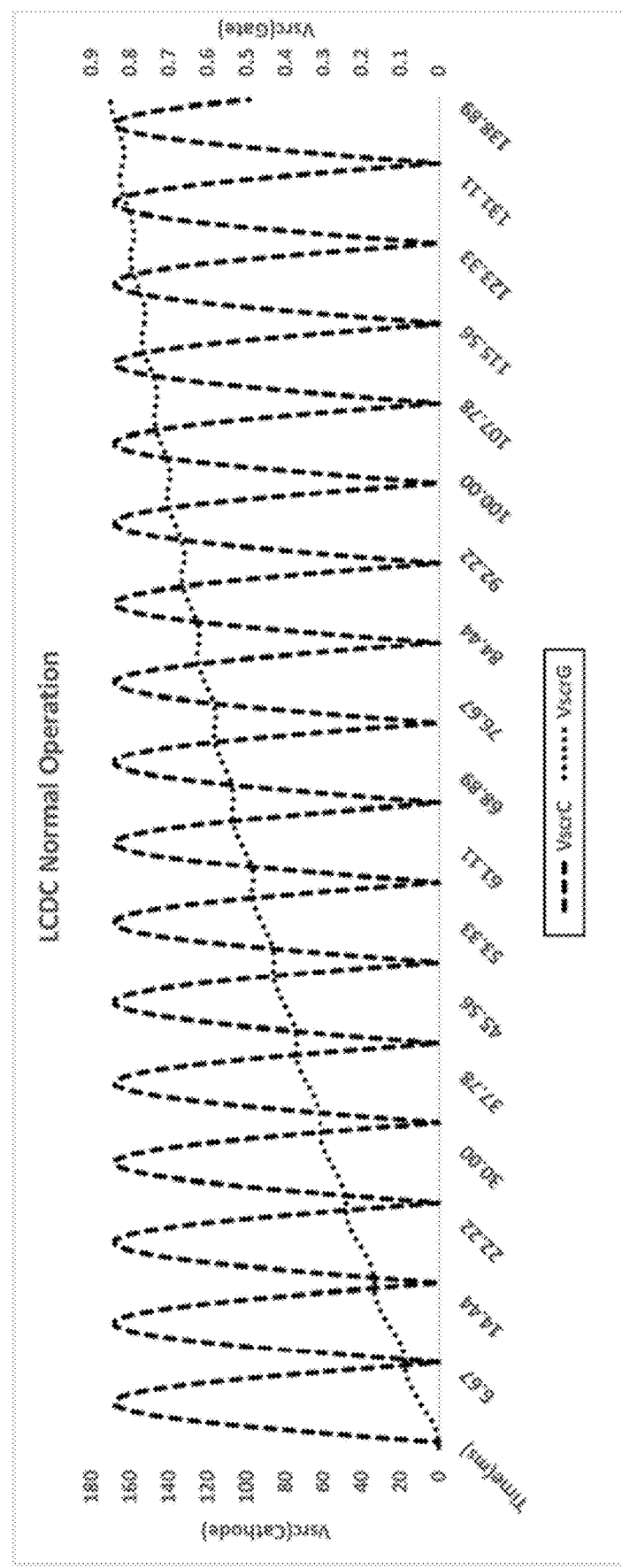
FIG. 14A is a waveform diagram for the normal condition of the Leakage Current Detection Circuit (LCDC) shown in FIG. 7 or FIG. 8.
Figure 14B:
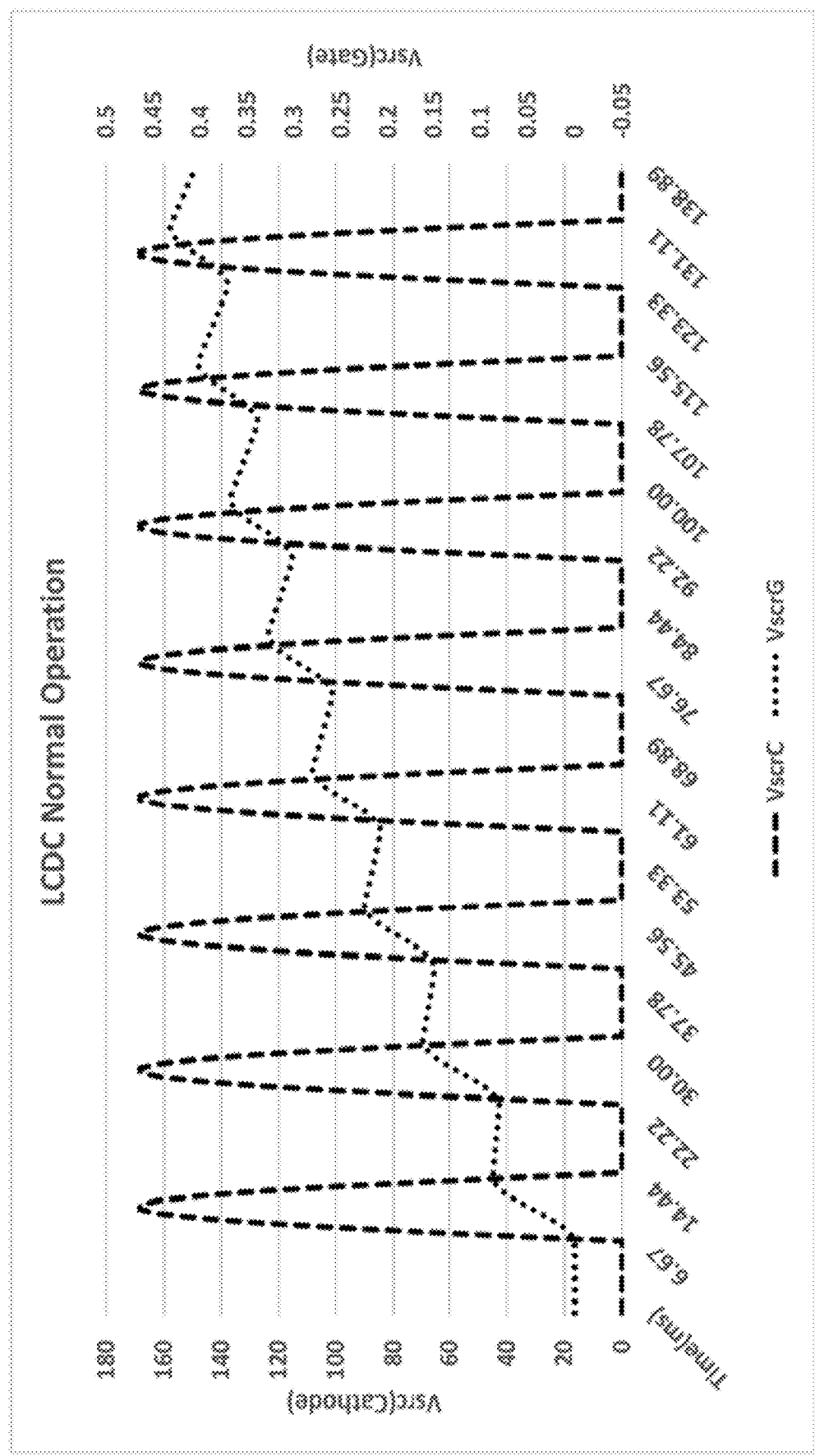
FIG. 14B is a waveform diagram for the normal condition of the Leakage Current Detection Circuit (LCDC) shown in FIG. 9 or FIG. 10.

R6 drops the amplitude of rectified unsmoothed DC signal at A to a predetermined amplitude at B. Voltage dividers R3/R7 drops the amplitude of rectified unsmoothed DC signal at B to a predetermined amplitude at C. Under normal conditions, the voltage amplitude at C, the gate of SCR2 LCDC switch 517A, is insufficient to trigger SCR2 into an on condition. It will be appreciated, however, that C3 charges to a voltage determined by R3, R7 to maintain a minimum voltage on the gate of SCR2. (See FIG. 14A for full wave rectification and FIG. 14B for half wave rectification.) If an adverse leakage condition occurs, e.g., arcing from AC line voltage to either shield 513 or 515, the gate voltage at C rises from the charge on C3 to trigger SCR2 into an on-condition. In the SCR2 on, or conducting condition, current flow through solenoid 519 is increased to a solenoid energizing level to disengage manual reset switch 518 and interrupt power between AC line source and load. Again, it is appreciated that not starting from zero gate voltage allows SCR2 to trigger faster when a fault is detected than if the gate voltage was starting from zero volts. It is also understood that inrush current can exceed the current carrying capability of board connectors as well as PCB traces, resulting in damaging the connectors and traces. Thus, maintaining a minimum C3 charge minimizes inrush current and potential circuit damage in the event of an arcing condition.

Still referring to FIG. 7, the rectified unsmoothed DC signal at B is routed to the base of npn transistor Q1, SIC controller 514A, via R2 (see FIG. 11A), biasing Q1 into an on condition during the positive cycle of the rectified unsmoothed DC. When Q1(B) voltage drops below $V_{BE}$ Q turns off and the voltage at Q1(C), SIC switch 514B, is near 0 v due to the unsmoothed DC signal at A dropping to near 0 v in the cycle. When the unsmoothed DC signal at A swings positive, Q1 is again biased on, dropping the unsmoothed DC signal at A across R8, keeping Q2 in an off condition during normal operation.

Still referring to FIG. 7, it is understood that under normal conditions the rectified unsmoothed DC signal at A is dropped across resistor R8 and that R8 is sized to allow an amount of AC current less than the SOL1 519 energizing current to flow through R8 through Q1 back to neutral when Q1 is conducting. During Q1's off state, or non-conducting state, SOL1 519 inductively opposes the change in current until Q1 again turns on, thus maintaining, or nearly maintaining the current flow through SOL1 519. It is understood and appreciated that the small amount of solenoid current flowing through solenoid SOL1 519 is less than the energizing current needed to energize solenoid 519 to disengage manual reset switch 518. It is further appreciated that not starting from zero energizing current allows solenoid 519 to energize faster when a fault is detected.

Still referring to FIG. 7, when shield integrity is compromised, such as, for example, a break in shields 513, 515, or a voltage drop across areas of corrosion within the power cable, the bias-on voltage $V_{BE}$ at the base of Q1 is insufficient to keep Q1 in its conductive state. (See FIG. 11B.) The voltage at the base of Q2 (Q1C) rises to Q2's bias-on voltage turning on Q2, sufficiently increasing current flow through solenoid 519 to energize solenoid 519 to disengage manual reset switch 518. Thus, interrupting power from the AC line source to the load. It is understood and appreciated that the full wave bridge rectifier 712 enables the SIC to detect and disconnect the AC line source from the load when a fault is detected during the positive or negative cycle of an input AC waveform (not shown). In other words, the SIC detects and interrupt power between the AC line source and load within 1 ms or less for a 60 Hz AC source.

Figure 8:
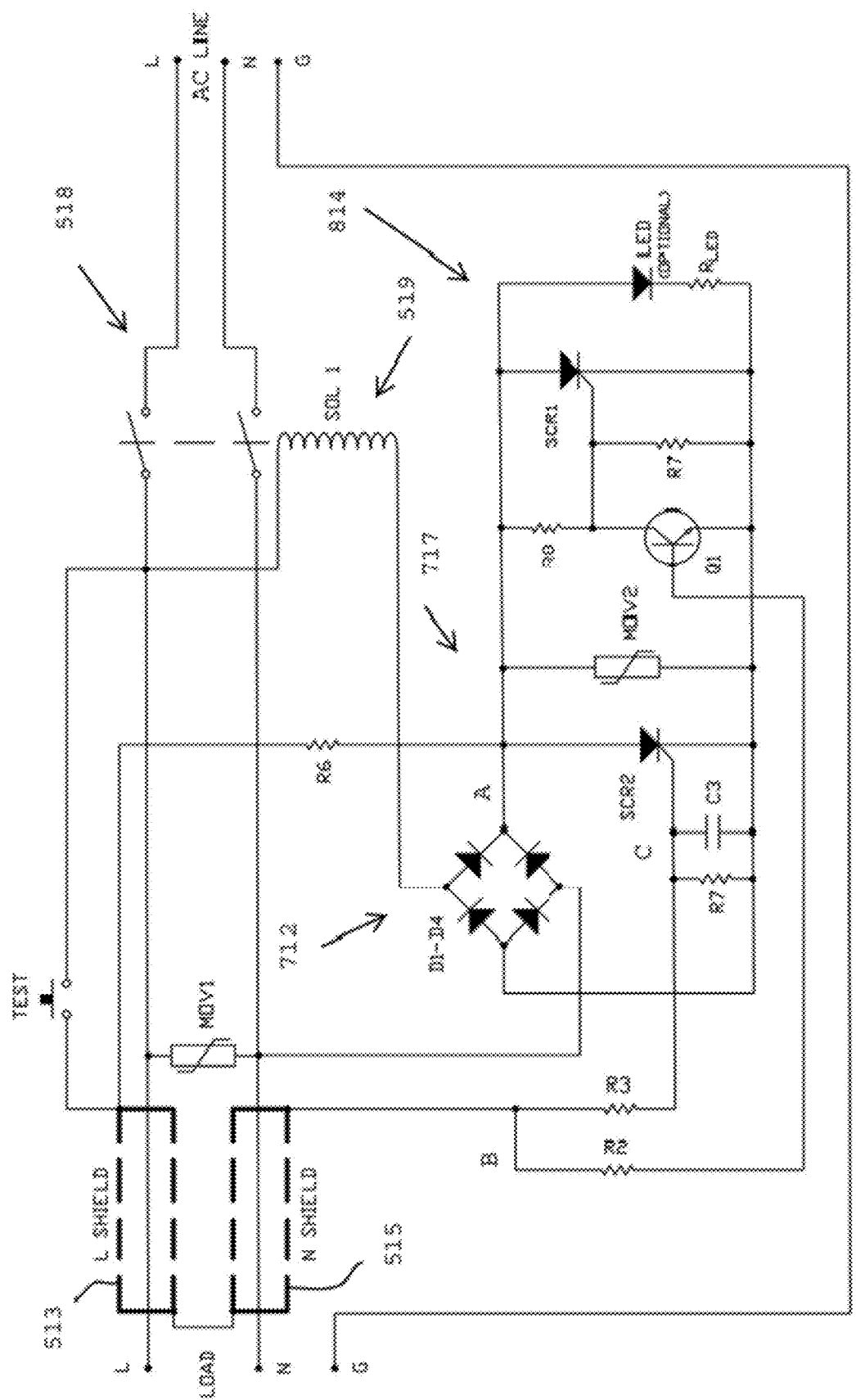
FIG. 8 is an alternate schematic diagram of the block diagram shown in FIG. 5.

Referring also to FIG. 8 is an alternate circuit diagram of the SIC block diagram shown in FIG. 5. The rectified unsmoothed DC signal at B is routed to the base of npn transistor Q1 via R2 biasing Q1 into an on condition, which in turn, drops rectified unsmoothed DC signal at A across R8. Thus, the gate voltage at the gate of SCR1 is insufficient to trigger SCR1. It is appreciated that the frequency of the rectified unsmoothed DC signal at the base of Q1 is of a sufficient frequency to keep Q1 in a mostly conductive state in normal operations thus inhibiting sufficient bias-on gate voltage at the gate of SCR1. In other words, for example, when the rectified unsmoothed DC voltage signal at the base of Q1 drops below the Q1 bias-on voltage, turning Q1 off, the bias-on gate voltage at the gate of SCR1 begins to rise. However, under normal conditions, before there is sufficient bias-on gate voltage at the gate of SCR1, Q1 turns back on, again dropping the gate voltage at the gate of SCR1 below sufficient bias-on voltage (see FIG. 11A).

Figure 11C:
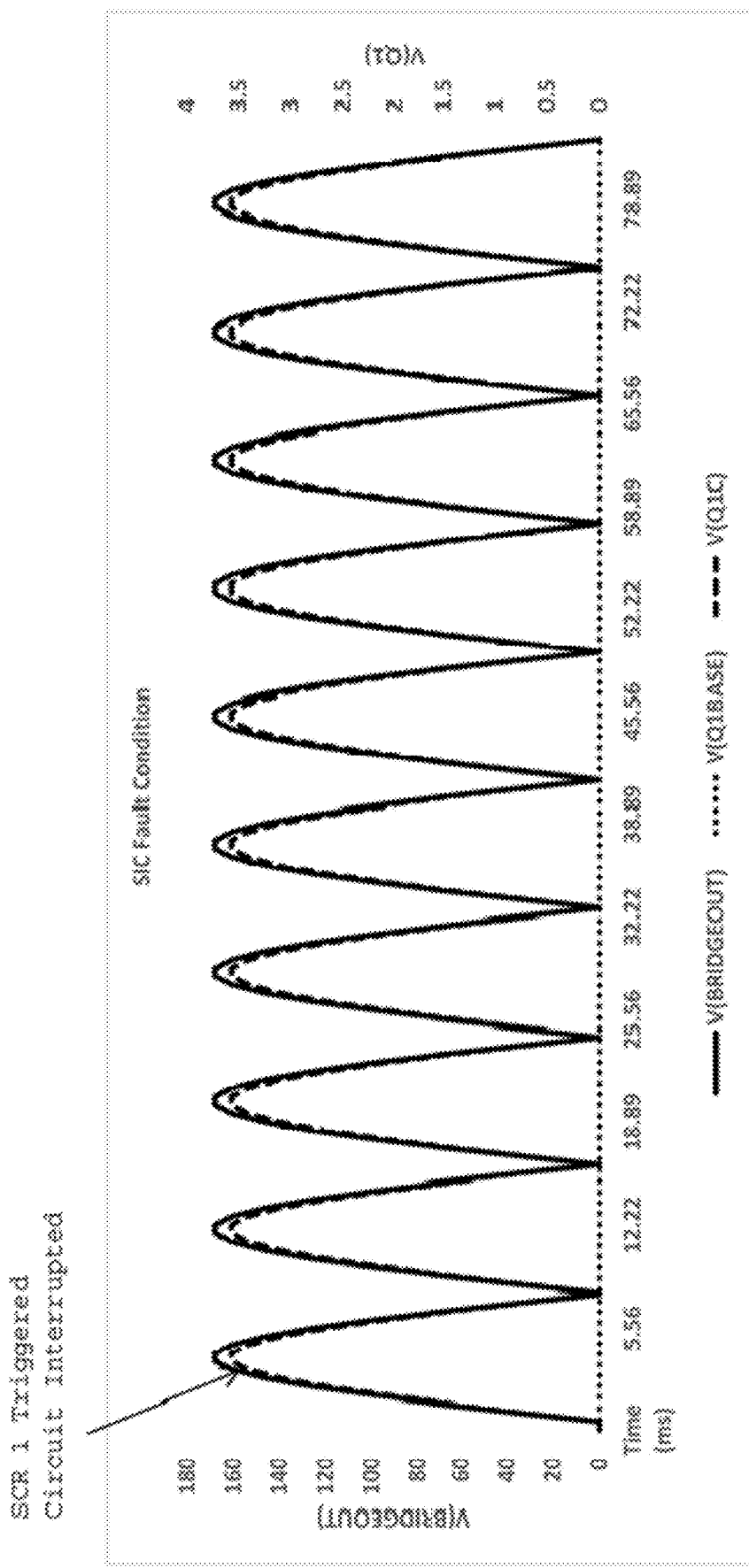
FIG. 11C is a waveform diagram for the fault condition of the SIC shown in FIG. 8.

When Q1 $V_{BE}$ voltage drops, i.e., due to fault such as, for example, a break in shields 513, 515, or a voltage drop across areas of corrosion, the bias-on voltage at the base of Q1 is insufficient to keep Q1 in its conductive state during the positive voltage swing a A. The gate voltage at the gate of SCR1 rises to SCR's gate bias-on voltage triggering SCR1 (see FIG. 11C) which sufficiently increases current flow through solenoid 519 to energize solenoid 519 to disengage manual reset switch 518. Thus, interrupting power from the AC line source to the load.

Figure 9:
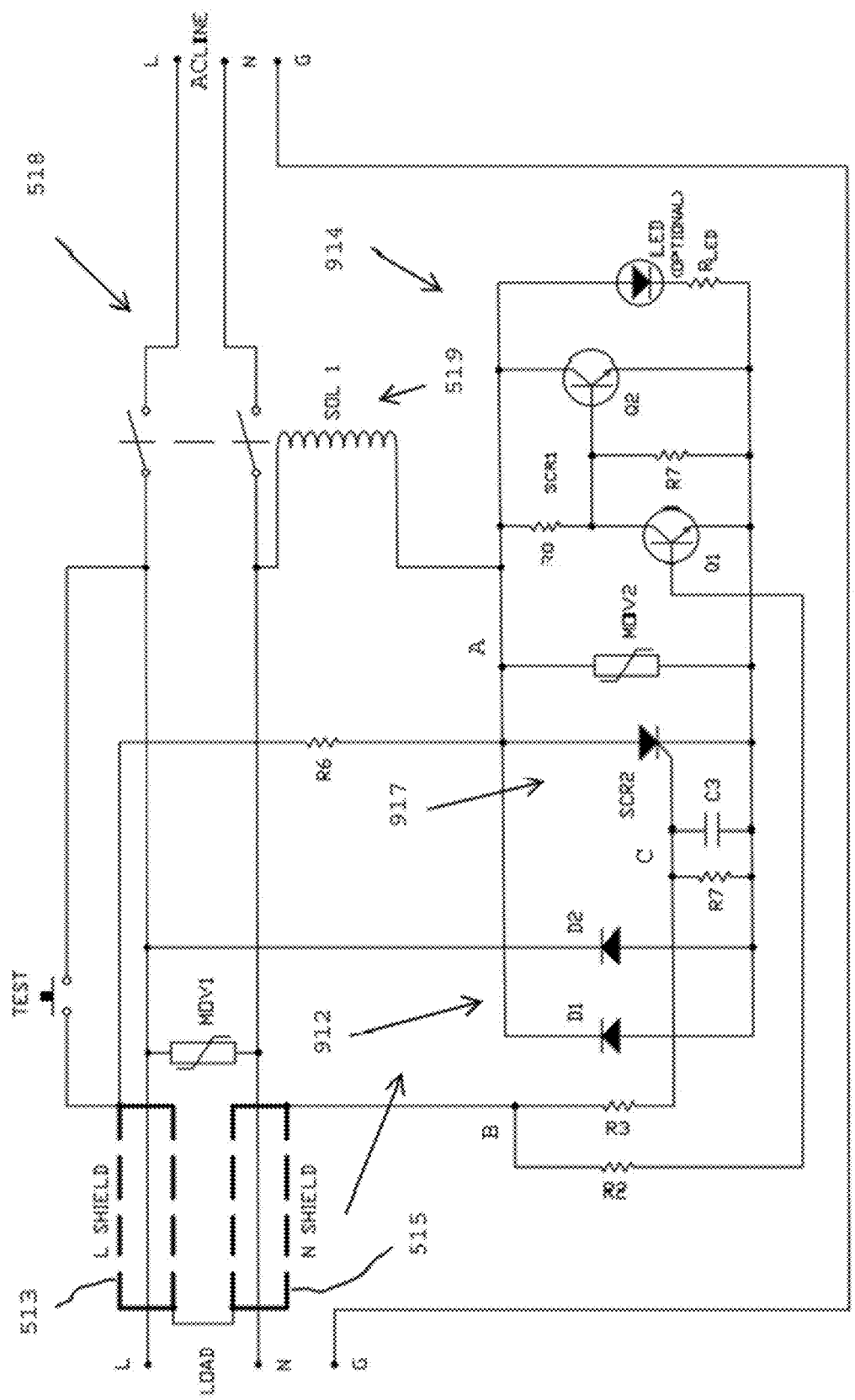
FIG. 9 is a detailed schematic diagram of the block diagram shown in FIG. 5.

Referring also to FIG. 9 there is shown an alternate detailed circuit 90 of the block diagram 50 shown in FIG. 5. LCDI circuit 90 includes line shield 513, neutral shield 515, switch 518, power supply circuit 912, leakage current detection circuit (LCDC) 917, solenoid 519, and shield integrity circuit (SIC) 914. As is described in more detail herein, when manual reset switch 518 is set line voltage is connected to LOAD and to power supply circuit 912 via solenoid 519. Power supply circuit 912 supplies bias voltages to LCDC 917, SIC 914, and shields 513 and 515. As is discussed and shown in more detail herein, the SIC 914 allows a small amount of solenoid current to flow through solenoid 519 but less than the energizing current needed to energize solenoid 519 to disengage manual reset switch 518. It is appreciated that not starting from zero energizing current allows solenoid 519 to energize faster when a fault is detected.

Figure 12A:
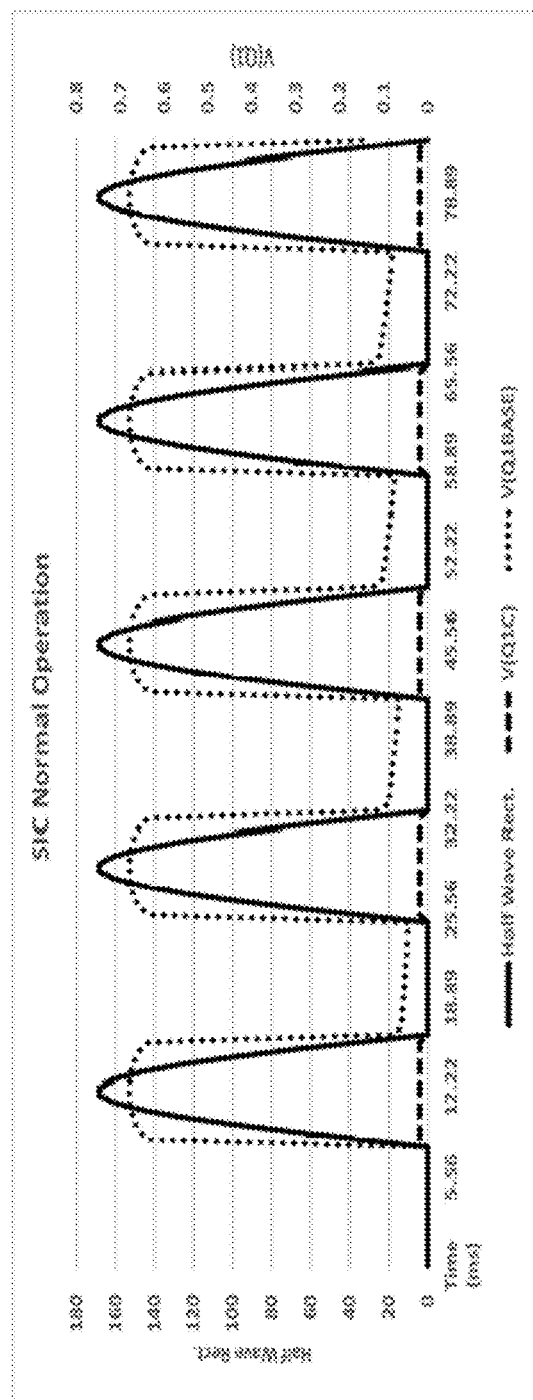
FIG. 12A is a waveform diagram for the normal condition of the SIC shown in FIG. 9 or FIG. 10.
Figure 12B:
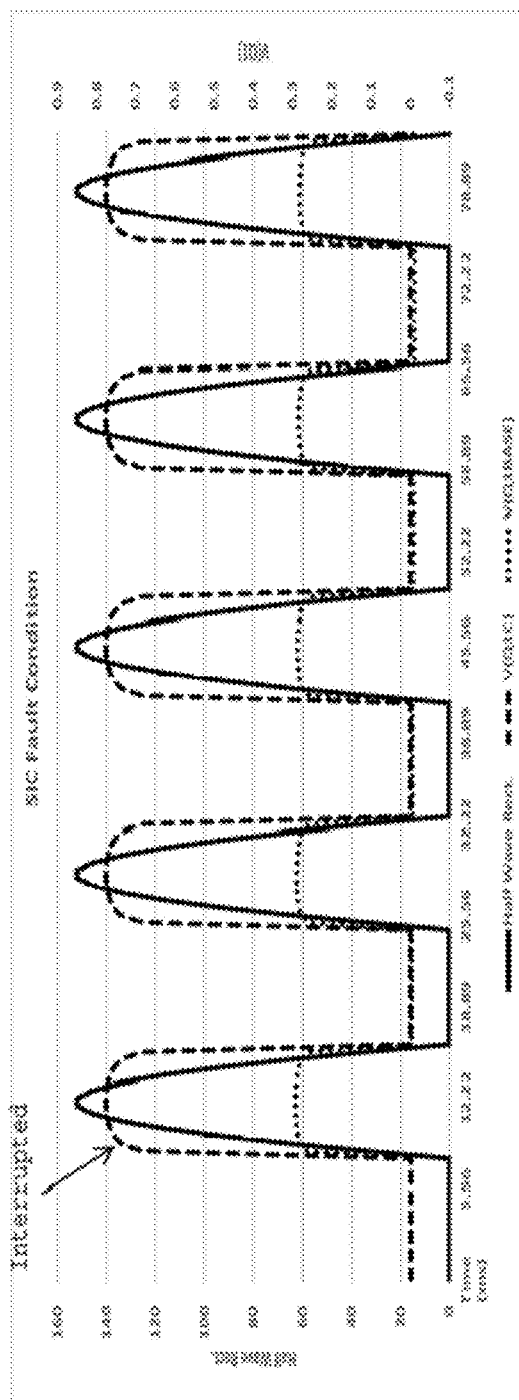
FIG. 12B is a waveform diagram for the fault condition of the SIC shown in FIG. 9.

Still referring to FIG. 9 and FIGS. 12A-12B. When switch 518 is mechanically (manually) engaged AC line voltage is connect to LOAD. 60 Hz AC line voltage is also connected to power supply circuit 912 via solenoid 519. Power supply circuit 912, comprising half wave rectifier (diodes D1-D2) outputs a half wave rectified unsmoothed DC signal at A. The rectified unsmoothed DC signal at A is routed through R6 to LCDC 917 and SIC 914, via shields 513 and 515 connected in series.

R6 drops the amplitude of rectified unsmoothed DC signal at A to a predetermined amplitude at B. Voltage dividers R3/R7 drops the amplitude of rectified unsmoothed DC signal at B to a predetermined amplitude at C. Under normal conditions, the voltage amplitude at C, the gate of SCR2 LCDC switch 517A, is insufficient to trigger SCR2 into an on condition. It will be appreciated, however, that C3 charges to a voltage determined by R3, R7 to maintain a minimum voltage on the gate of SCR2. If an adverse leakage condition occurs, e.g., arcing from AC line voltage to either shield 513 or 515, the gate voltage at C rises from the charge on C3 to trigger SCR2 into an on-condition. In the SCR2 on, or conducting condition, current flow through solenoid 519 is increased to a solenoid energizing level to disengage manual reset switch 518 and interrupt power between AC line source and load. Again, it is appreciated that not starting from zero gate voltage allows SCR2 to trigger faster when a fault is detected than if the gate voltage was starting from zero volts.

Still referring to FIG. 9, the half wave rectified unsmoothed DC signal at B is routed to the base of npn transistor Q1, via R2 (see FIG. 1A), biasing Q into an on condition during the positive cycle of the rectified unsmoothed signal. When Q1(B) voltage drops below $V_{BE}$ Q1 turns off and the voltage at Q1(C), is near 0 v due to the unsmoothed signal at A dropping to near 0 v in the cycle. When the unsmoothed DC signal at A swings positive, Q1 is again biased on, dropping the unsmoothed DC signal at A across R8, keeping Q2 in an off condition during normal operation.

Still referring to FIG. 9, it is understood that under normal conditions the rectified unsmoothed signal at A is dropped across resistor R8 and that R8 is sized to allow an amount of AC current less than the SOL1 519 energizing current to flow through R8 through Q1 back to neutral when Q1 is conducting. During Q1's off state, or non-conducting state, SOL1 519 inductively opposes the change in current until Q1 again turns on, thus maintaining, or nearly maintaining the current flow through SOL1 519. It is understood and appreciated that the small amount of solenoid current flowing through solenoid SOL1 519 is less than the energizing current needed to energize solenoid 519 to disengage manual reset switch 518. It is further appreciated that not starting from zero energizing current allows solenoid 519 to energize faster when a fault is detected.

Still referring to FIG. 9, when shield integrity is compromised, such as, for example, a break in shields 513, 515, or a voltage drop across areas of corrosion within the power cable, the bias-on voltage Vat at the base of Q1 is insufficient to keep Q in its conductive state. (See FIG. 12B.) The voltage at the base of Q2 (Q1C) rises to Q2's bias-on voltage turning on Q2, sufficiently increasing current flow through solenoid 519 to energize solenoid 519 to disengage manual reset switch 518. Thus, interrupting power from the AC line source to the load.

Figure 10:
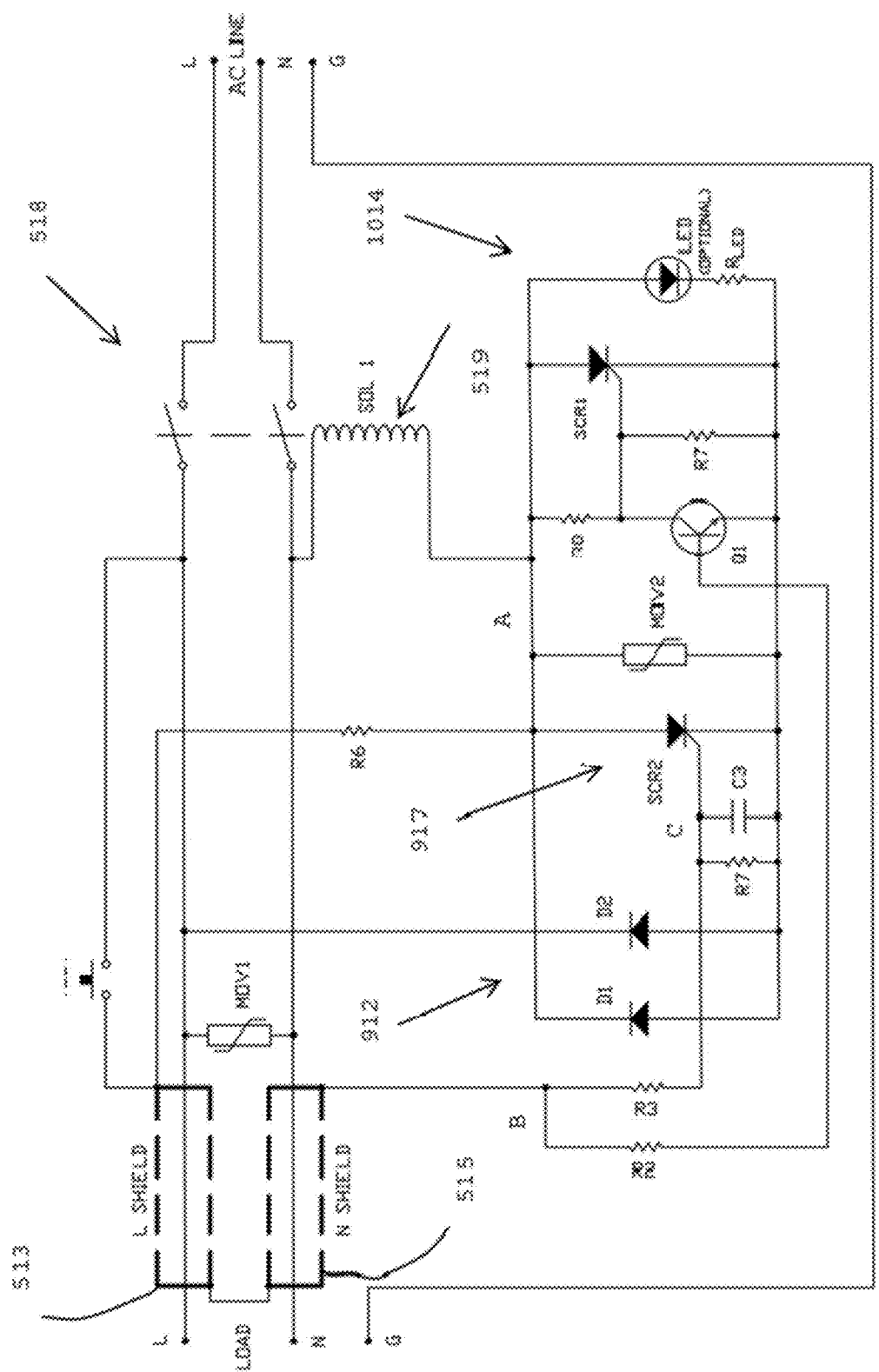
FIG. 10 is an alternate schematic diagram of the block diagram shown in FIG. 5.

Referring also to FIG. 10 is an alternate circuit diagram of the SIC block diagram shown in FIG. 5. The half wave rectified unsmoothed DC signal at B is routed to the base of npn transistor Q1 via R2 biasing Q into an on condition, which in turn, drops rectified unsmoothed DC signal at A across R8. Thus, the gate voltage at the gate of SCR1 is insufficient to trigger SCR1. It is appreciated that the frequency of the half wave rectified unsmoothed DC signal at the base of Q1 is of a sufficient frequency to keep Q1 in a mostly conductive state in normal operations thus inhibiting sufficient bias-on gate voltage at the gate of SCR. In other words, for example, when the rectified unsmoothed DC voltage signal at the base of Q1 drops below the Q1 bias-on voltage, turning Q1 off, the bias-on gate voltage at the gate of SCR1 begins to rise. However, under normal conditions, before there is sufficient bias-on gate voltage at the gate of SCR1, Q1 turns back on, again dropping the gate voltage at the gate of SCR1 below sufficient bias-on voltage (see FIG. 12A).

Figure 12C:
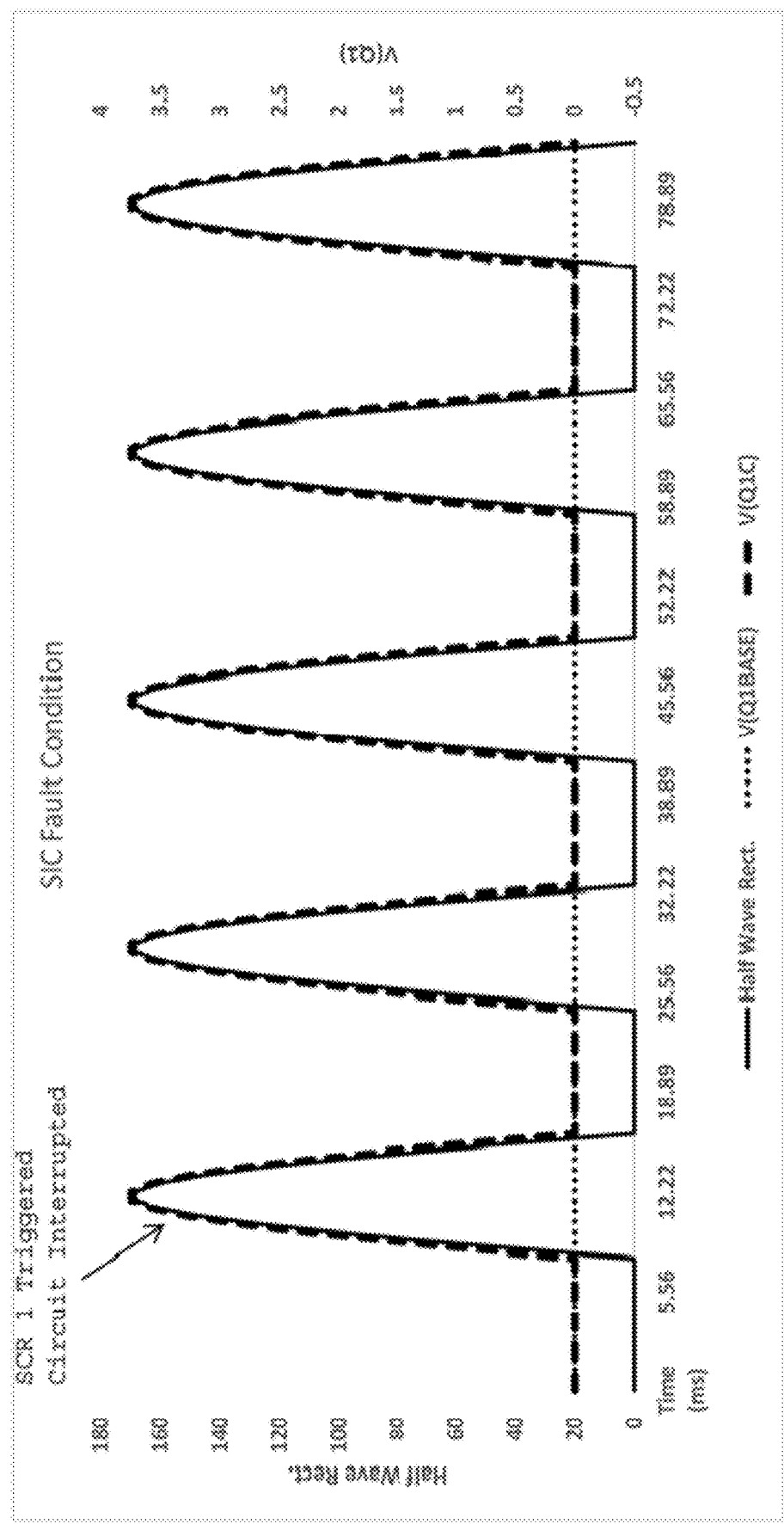
FIG. 12C is a waveform diagram for the fault condition of the SIC shown in FIG. 10.

When Q1 $V_{BE}$ voltage drops, i.e., due to fault such as, for example, a break in shields 513, 515, or a voltage drop across areas of corrosion, the bias-on voltage at the base of Q1 is insufficient to keep Q1 in its conductive state during the positive voltage swing a A. The gate voltage at the gate of SCR1 rises to SCR1's gate bias-on voltage triggering SCR1 (see FIG. 12C) which sufficiently increases current flow through solenoid 519 to energize solenoid 519 to disengage manual reset switch 518. Thus, interrupting power from the AC line source to the load.

Figure 10A:
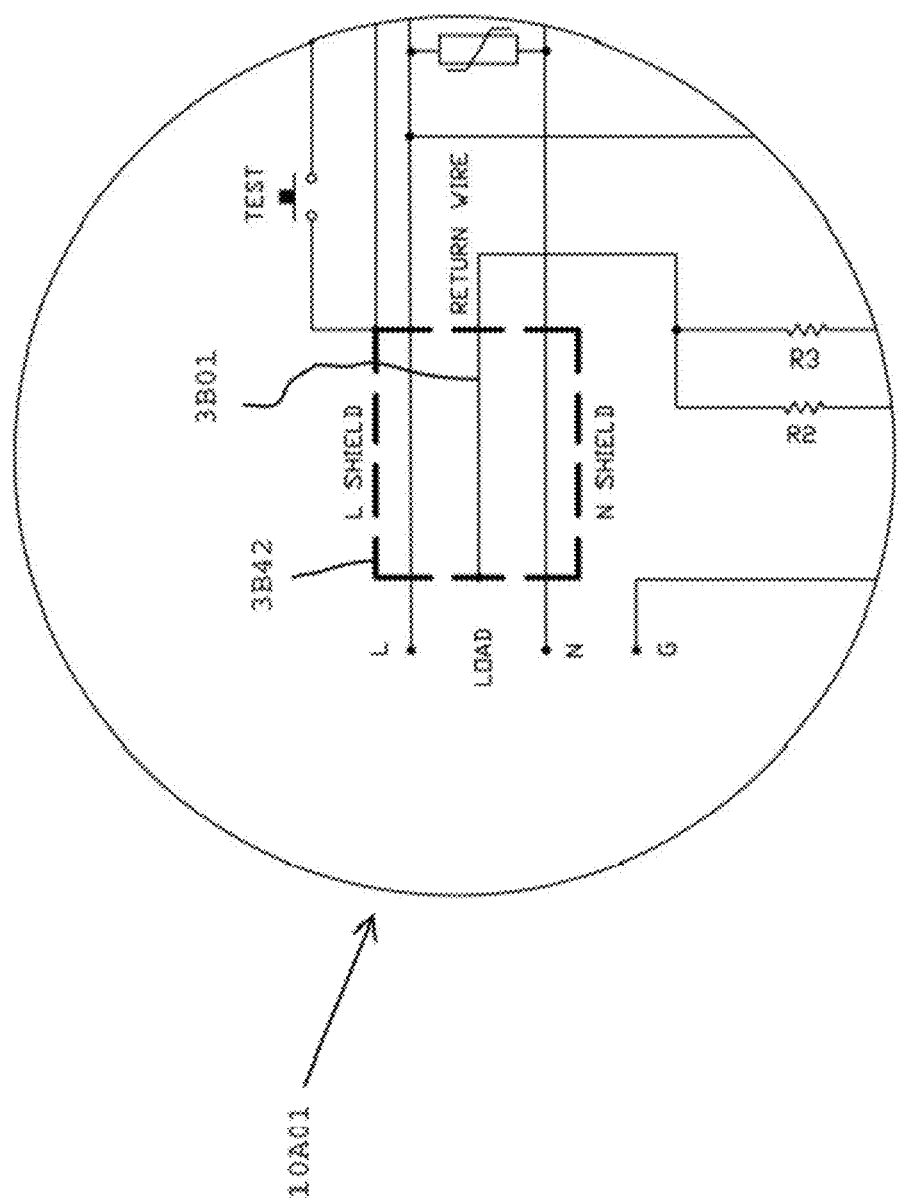
FIG. 10A is an exploded partial view of a circuit connection of the return wire shown in FIGS. 3B-E.

Referring also to FIG. 10A there is shown an exploded partial view of a circuit connection of the return wire shown in FIGS. 3B-E. Those skilled in the art will appreciate the alternate shield connections to circuits described earlier.

Figure 13:
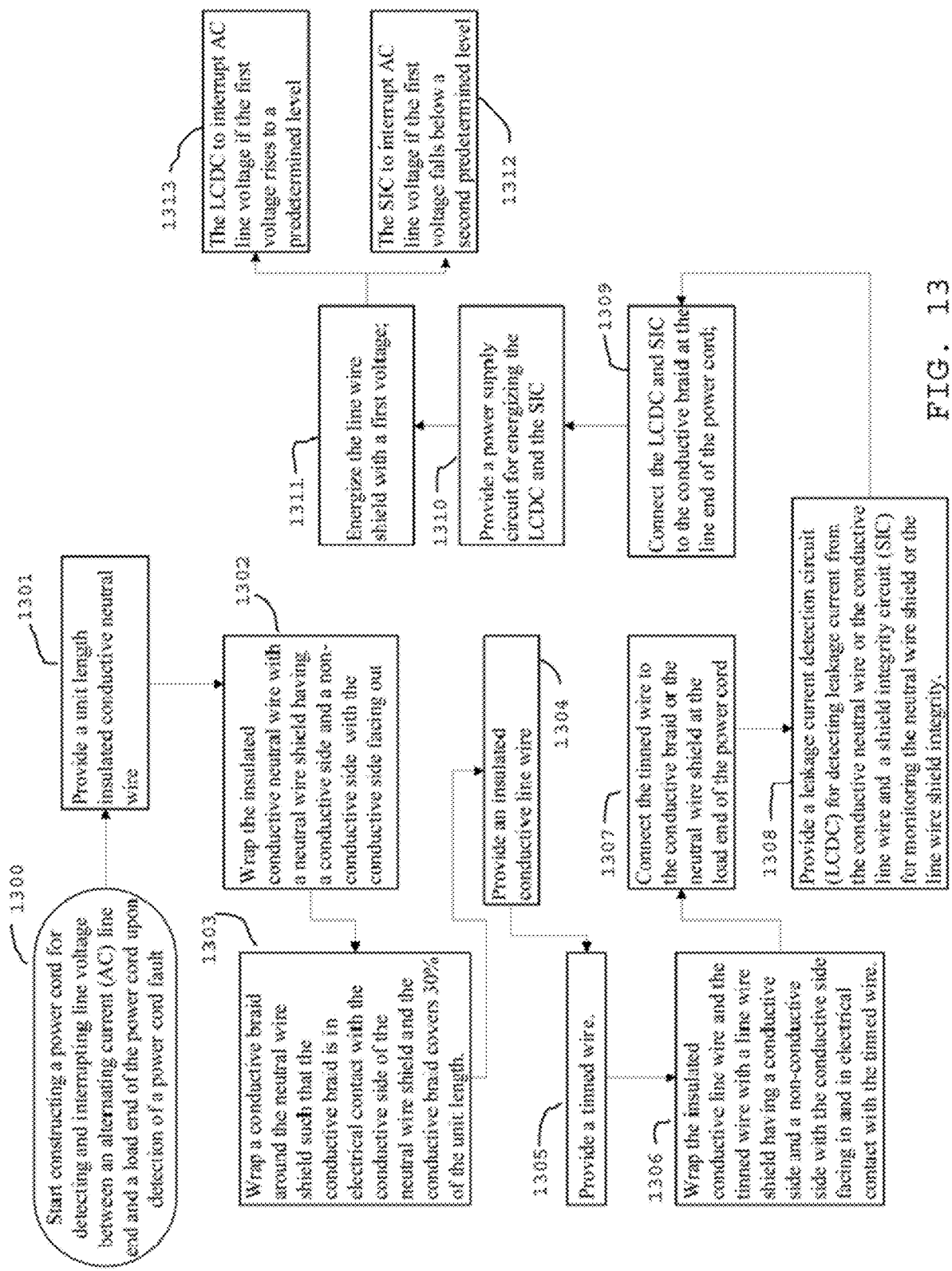
FIG. 13 illustrates a flow diagram of a method for constructing a power cord for detecting and interrupting line voltage between an AC line end and a load end of the power cord in accordance with the present invention.

Referring also to FIG. 13 there is shown a flow diagram illustration of a method for constructing a power cord for detecting and interrupting line voltage between an AC line end and a load end of the power cord in accordance with the present invention 1300.

Step 1301 provides a unit length of an insulated conductive neutral wire. Step 1302 wraps the insulated neutral wire with a conductive wrapping having a conductive side and a non-conductive side, with the conductive side facing out. The conductive side of the wrapping may be any suitable conductive material such as, for example, aluminum foil. Step 1303 wraps a conductive flexible media around the wrapped neutral wire such that the flexible media is in electrical contact with the conductive side of the conductive wrap and covers 30% of the unit length of the wrapped neutral wire. The conductive flexible media may be any suitable conductive material such as a copper flexible media, or a conductive flexible media woven from conductive material such as, but not limited to, high-performance carbon fiber/gold/copper composite wire, conductive graphene wire, or conductive graphene yarn.

Step 1304 provides a unit length insulated conductive line wire and step 1305 provides a unit length tinned conductive wire. The tinned wire may be any suitable conductive wire such as a solid conductive wire or stranded conductive wire. Step 1306 wraps the tinned wire and the insulated conductive line wire with a line wire shield having a conductive and non-conductive side with the conductive side facing in and in electrical contact with the tinned wire. (See FIGS. 3A-3B)

Step 1307 connects the tinned wire to the conductive flexible media or neutral shield at the load end of the power cord.

Step 1308 provides a leakage current detection circuit (LCDC) for detecting leakage current from the conductive neutral wire or the conductive line wire and a shield integrity circuit (SIC) for monitoring the neutral wire shield or the line wire shield integrity. The LCDC and SIC may be any of the embodiments previously described.

Step 1309 connects the LCDC and SIC to the conductive flexible media at the line end of the neutral shield conductor. It is understood that the shields described herein are connected in series at the load end of the power cord. Step 1310 provides a power supply circuit for energizing the LCDC and SIC and also energizes the line wire shield at the line end of the line wire shield with a first voltage.

Step 1313 interrupts AC line voltage if the LCDC detects a voltage (e.g., an arcing condition) rising above the first voltage.

Step 1314 interrupts AC line voltage if the SIC detects the first voltage falling below a second predetermined level. (See FIGS. 11A-12C).

Figure 13A:
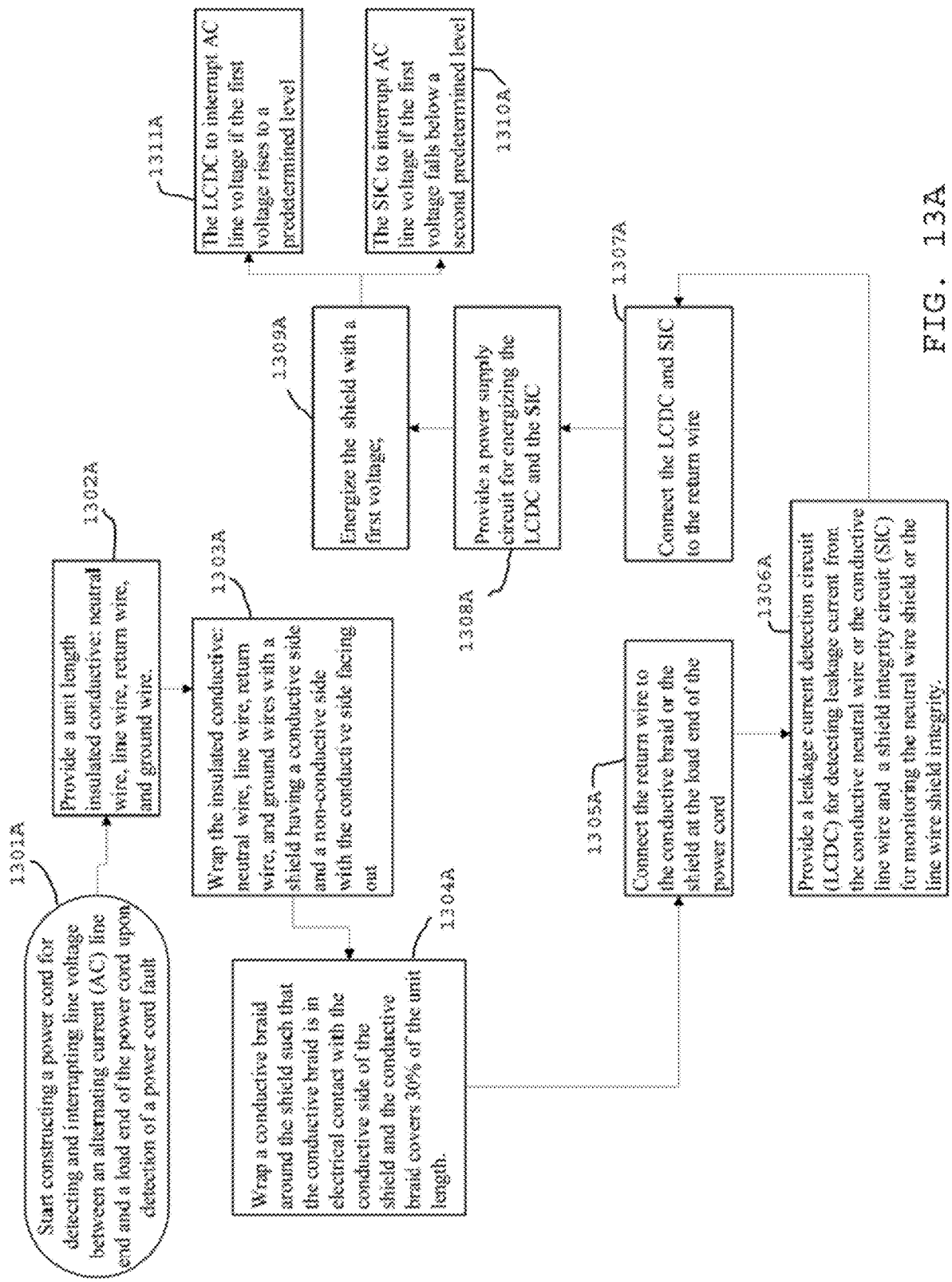
FIG. 13A illustrates a flow diagram of an alternate method for constructing a power cord for detecting and interrupting line voltage between an AC line end and a load end of the power cord in accordance with the present invention.

Referring also to FIG. 13A there is shown an illustration of a flow diagram of an alternate method for constructing a power cord for detecting and interrupting line voltage between an AC line end and a load end of the power cord in accordance with the present invention, step 1301A.

Step 1302A provides a unit length insulated conductive: neutral wire, line wire, return wire, and ground wire. Step 1303A wraps the insulated conductive: neutral wire, line wire, return wire, and ground wires with a shield having a conductive side and a non-conductive side with the conductive side of the shield facing out. (See FIGS. 3B-3C) The conductive side of the wrapping may be any suitable conductive material such as, for example, aluminum foil.

Step 1304A wraps a conductive flexible media around the shield such that the conductive flexible media is in electrical contact with the conductive side of the shield and the conductive flexible media covers 30% of the unit length. The conductive flexible media may be any suitable conductive material such as a copper flexible media, or a conductive flexible media woven from conductive material such as, but not limited to, high-performance carbon fiber/gold/copper composite wire, conductive graphene wire, or conductive graphene yarn.

Step 1305A connects the return wire to the conductive flexible media and/or the shield at the load end of the power cord.

Steps 1306A and 1307A provides a leakage current detection circuit (LCDC) for detecting leakage current from the conductive neutral wire or the conductive line wire; and a shield integrity circuit (SIC) for monitoring the neutral wire shield or the line wire shield integrity. The LCDC and the SIC are connected to the return wire. The LCDC and SIC may be any of the embodiments previously described.

Step 1308A provides a leakage current detection circuit (LCDC) for detecting leakage current from the conductive neutral wire or the conductive line wire and a shield integrity circuit (SIC) for monitoring the neutral wire shield or the line wire shield integrity. The LCDC and SIC may be any of the embodiments previously described.

Step 1309A connects the LCDC and SIC to the conductive flexible media via the return wire. It is understood that the shields described herein are connected in series at the load end of the power cord.

Step 1310A provides a power supply circuit for energizing the LCDC and SIC and also energizes the line wire shield at the line end of the line wire shield with a first voltage.

Step 1313A interrupts AC line voltage if the LCDC detects a voltage (e.g., an arcing condition) rising above the first voltage.

Step 1314A interrupts AC line voltage if the SIC detects the first voltage falling below a second predetermined level. (See FIGS. 11A-12C).

Figure 13B:
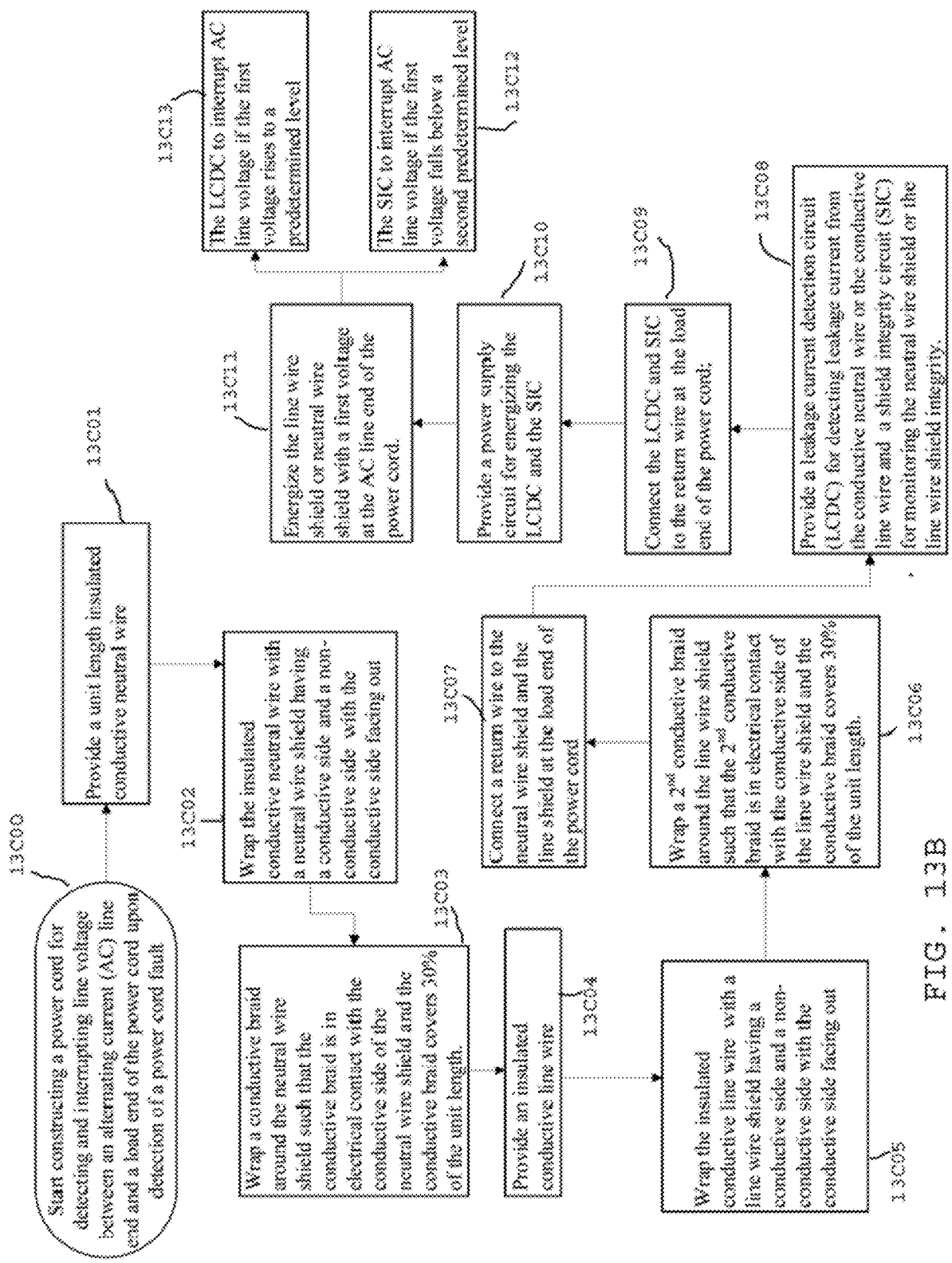
FIG. 13B illustrates a flow diagram of a second alternate method for constructing a power cord for detecting and interrupting line voltage between an AC line end and a load end of the power cord in accordance with the present invention.

Referring also to FIG. 13B there is shown an illustration of a flow diagram of a second alternate method for constructing a power cord for detecting and interrupting line voltage between an AC line end and a load end of the power cord in accordance with the present invention, step 13C00.

Step 13C01 provides a unit length insulated conductive neutral wire. Step 13C02 wraps the insulated conductive neutral wire with a neutral wire shield having a conductive side and a non-conductive side, with the conductive side facing out. Step 13C03 wraps a conductive flexible media around the neutral wire shield such that the conductive flexible media is in electrical contact with the conductive side of the neutral wire shield and the conductive flexible media covers 30% of the unit length. The conductive flexible media may be any suitable conductive material such as a copper flexible media, or a conductive flexible media woven from conductive material such as, but not limited to, high-performance carbon fiber/gold/copper composite wire, conductive graphene wire, or conductive graphene yarn.

Steps 13C04 through 13C06 provide a unit length insulated conductive line wire. The insulated conductive line wire is wrapped with a neutral wire shield having a conductive side and a non-conductive side, with the conductive side facing out. A conductive flexible media is wrapped around the line wire shield such that the conductive flexible media is in electrical contact with the conductive side of the line wire shield and the conductive flexible media covers 30% of the unit length. The conductive flexible media may be any suitable conductive material such as a copper flexible media, or a conductive flexible media woven from conductive material such as, but not limited to, high-performance carbon fiber/gold/copper composite wire, conductive graphene wire, or conductive graphene yarn. (See FIGS. 3D-3E)

Step 13C07 connects a return wire to the line wire shield and the neutral wire shield at the load end of the power cord. Steps 3C08 and 13C09 provide a leakage current detection circuit (LCDC) for detecting leakage current from the conductive neutral wire or the conductive line wire and a shield integrity circuit (SIC) for monitoring the neutral wire shield or the line wire shield integrity. The LCDC and SIC are connected to the return wire.

Step 13C10 provides a power supply circuit for energizing the LCDC and SIC and also energizes the line wire shield at the line end of the line wire shield with a first voltage. Step 13C13 interrupts AC line voltage if the LCDC detects a voltage (e.g., an arcing condition) rising above the first voltage. Step 13C14 interrupts AC line voltage if the SIC detects the first voltage falling below a second predetermined level. (See FIGS. 11A-12C).

It should be understood that the foregoing description is only illustrative of the invention. Thus, various alternatives and modifications can be devised by those skilled in the art without departing from the invention. For example, solid state devices SCR1 or Q2 can be any suitable solid-state device. Accordingly, the present invention is intended to embrace all such alternatives, modifications and variances that fall within the scope of the appended claims.

What is claimed is:

1. An alternating current (AC) power cord having a load end and a source end, the AC power cord comprising:
   a neutral wire assembly, wherein the neutral wire assembly comprises:
      a conductive neutral wire;
      a neutral wire insulator surrounding the conductive neutral wire;
      a conductive neutral wire shield surrounding the neutral wire insulator, the conductive neutral wire shield comprising:
         a first conductive side;
         a first non-conductive side, wherein the non-conductive side is adjacent to the outside of the neutral wire insulator; and
         a conductive flexible media surrounding and adjacent to the first conductive side;
         a conductive neutral wire shield load end;
         conductive neutral wire shield line end;
   a line wire, assembly, wherein the line wire assembly comprises;
      a conductive line wire;
      a line wire insulator surrounding the conductive line wire;
      a conductive line wire shield surrounding the line wire insulator; and
   wherein the conductive line wire shield and the conductive neutral wire shield are connected in series at the load end of the AC power cord to form an electrical path form the source end of the neutral wire shield to the source end of line wire shield.

2. The AC power cord as in claim 1, wherein the first conductive side comprises a first aluminum foil.

3. The AC power cord as in claim 1 wherein the conductive flexible media comprises a copper flexible media wherein the copper flexible media comprises a 30% copper flexible media coverage per unit length of the power cord.

4. The AC power cord as in claim 1 wherein the conductive flexible media is selected from the group consisting of high-performance carbon fiber/gold/copper composite wire, conductive graphene wire, and conductive graphene yarn.

5. The AC power cord as in claim 1 wherein the neutral wire assembly further comprises an immersion detection cable adjacent to the conductive flexible media, wherein the immersion detection cable comprises a conductive wire surrounded by an absorbent covering.

6. The AC power cord as in claim 1 wherein the power cord further comprises an immersion detection cable, wherein the immersion detection cable comprises a twisted wire pair, wherein each of the twisted wires comprises an absorbent covering.

7. The AC power cord as in claim 1 wherein the conductive line wire shield surrounding the line wire insulator further comprises
 a second conductive shield surrounding the line wire insulator, wherein the second conductive shield comprises:
  a second non-conductive side;
  a second conductive side, wherein the second conductive side is adjacent to
  the outside of the line wire insulator; and
 a tinned wire disposed between the conductive line wire shield and the line wire insulator.

8. The AC power cord as in claim 7, wherein the second conductive side comprises a second aluminum foil.

9. An alternating current (AC) power cord having a load end and a source end, the AC power cord comprising:
 an insulated neutral wire;
 an insulated line wire;
 an insulated return wire;
 a ground wire;
 a conductive shield surrounding the insulated neutral wire, the insulated line wire, the insulated return wire, and the ground wire, the conductive shield comprising:
  a first conductive side, wherein the first conductive side faces outwards;
  a first non-conductive side, wherein the first conductive side faces inwards;
  a conductive flexible media surrounding and adjacent to the first conductive side of the conductive shield; and
 wherein the conductive shield and the return wire are connected in series at the load end of the AC power cord.

10. The AC power cord as in claim 9, wherein the first conductive side comprises a first aluminum foil.

11. The AC power cord as in claim 9 wherein the conductive flexible media comprises a copper flexible media wherein the copper flexible media comprises a 30% copper flexible media coverage per unit length of the power cord.

12. The AC power cord as in claim 9 wherein the conductive flexible media is selected from the group consisting of high-performance carbon fiber/gold/copper composite wire, conductive graphene wire, and conductive graphene yarn.

13. The AC power cord as in claim 9 further comprises at least one immersion detection cable adjacent to the conductive flexible media, wherein the at least one immersion detection cable comprises a conductive wire surrounded by an absorbent covering.

14. An alternating current (AC) power cord having a load end and a source end, the AC power cord comprising:
 a neutral wire assembly, wherein the neutral wire assembly comprises:
  a conductive neutral wire;
  a neutral wire insulator surrounding the conductive neutral wire;
  a conductive neutral wire shield surrounding the neutral wire insulator, the conductive neutral wire shield comprising:
   a first conductive side;
   a first non-conductive side, wherein the non-conductive side is adjacent to the outside of the neutral wire insulator; and
   a conductive flexible media surrounding and adjacent to the first conductive side;
 a line wire, assembly, wherein the line wire assembly comprises;
  a conductive line wire;
  a line wire insulator surrounding the conductive line wire;
  a conductive line wire shield surrounding the line wire insulator; and
 wherein the conductive line wire shield and the conductive neutral wire shield are connected in series at the load end of the AC power cord.

15. The AC power cord as in claim 14, wherein the first conductive side comprises a first aluminum foil.

16. The AC power cord as in claim 14 wherein the conductive flexible media comprises a copper flexible media wherein the copper flexible media comprises a 30% copper flexible media coverage per unit length of the power cord.

17. The AC power cord as in claim 14 wherein the conductive flexible media is selected from the group consisting of high-performance carbon fiber/gold/copper composite wire, conductive graphene wire, and conductive graphene yarn.

18. The AC power cord as in claim 14 wherein the conductive line wire shield surrounding the line wire insulator further comprises
 a second conductive shield surrounding the line wire insulator, wherein the second conductive shield comprises:
  a second non-conductive side wherein the second non-conductive side is adjacent to the outside of the line wire insulator; and
  a second conductive side; a second conductive flexible media surrounding and adjacent to the second conductive side.

19. The AC power cord as in claim 18, wherein the second conductive side comprises a second aluminum foil.

20. The AC power cord as in claim 18 wherein the conductive flexible media comprises a second copper flexible media wherein the second copper flexible media comprises a 30% copper flexible media coverage per unit length of the power cord.

21. The AC power cord as in claim 18 wherein the conductive flexible media is selected from the group consisting of high-performance carbon fiber/gold/copper composite wire, conductive graphene wire, and conductive graphene yarn.

22. The AC power cord as in claim 14 further comprises at least one immersion detection cable adjacent to the conductive flexible media, wherein the at least one immersion detection cable comprises a conductive wire surrounded by an absorbent covering.

23. An alternating current (AC) power cord having a load end and a source end, comprising:
- a neutral wire assembly, wherein the neutral wire assembly comprises:
  - a conductive neutral wire;
  - a neutral wire insulator surrounding the conductive neutral wire;
  - a conductive neutral wire shield surrounding the neutral wire insulator, the conductive neutral wire shield comprising:
    - a first conductive side;
    - a first non-conductive side, wherein the non-conductive side is adjacent to the outside of the neutral wire insulator; and
    - a conductive flexible media surrounding and adjacent to the first conductive side, wherein the conductive flexible media comprises a 30% copper flexible media coverage per unit length of the power cord;
- a line wire, assembly, wherein the line wire assembly comprises;
  - a conductive line wire;
  - a line wire insulator surrounding the conductive line wire;
  - a conductive line wire shield surrounding the line wire insulator, the conductive line wire shield comprising:
    - a second conductive shield surrounding the line wire insulator, wherein the second conductive shield comprises:
      - a second non-conductive side;
      - a second conductive side, wherein the second conductive side is adjacent to the outside of the line wire insulator; and
    - a tinned wire disposed between the conductive line wire shield and the line wire insulator; and
    - wherein the tinned wire is connected in series with the conductive neutral wire shield load end.

24. The AC power cord as in claim 23 wherein the conductive flexible media is selected from the group consisting of copper, high-performance carbon fiber/gold/copper composite wire, conductive graphene wire, and conductive graphene yarn.

25. An alternating current (AC) power cord having a load end and a source end, comprising:
- a neutral wire assembly, wherein the neutral wire assembly comprises:
  - a conductive neutral wire;
  - a neutral wire insulator surrounding the conductive neutral wire;
  - a conductive neutral wire shield surrounding the neutral wire insulator, the conductive neutral wire shield comprising:
    - a first conductive side;
    - a first non-conductive side, wherein the non-conductive side is adjacent to the outside of the neutral wire insulator; and
    - a conductive flexible media surrounding and adjacent to the first conductive side, wherein the conductive flexible media comprises a 30% flexible media coverage per unit length of the power cord;
- a line wire, assembly, wherein the line wire assembly comprises;
  - a conductive line wire;
  - a line wire insulator surrounding the conductive line wire;
  - a conductive line wire shield surrounding the line wire insulator, the conductive line wire shield comprising:
    - a second conductive shield surrounding the line wire insulator, wherein the second conductive shield comprises:
      - a second non-conductive side wherein the second non-conductive side is adjacent to the outside of the line wire insulator;
      - a second conductive side;
      - a second conductive flexible media surrounding and adjacent to the second conductive side, wherein the second conductive flexible media comprises a 30% flexible media coverage per unit length of the AC power cord; and
- wherein the conductive line wire shield and the conductive neutral wire shield are connected in series at the load end of the AC power cord to form an electrical path form the source end of the neutral wire shield to the source end of line wire shield.

* * * * *